United States Patent
Fujita et al.

(10) Patent No.: US 9,405,211 B2
(45) Date of Patent: *Aug. 2, 2016

(54) LIGHT SOURCE DRIVE CIRCUIT, OPTICAL SCANNING APPARATUS, AND IMAGE FORMING APPARATUS

(71) Applicant: RICOH COMPANY, LTD., Tokyo (JP)

(72) Inventors: Hayato Fujita, Kanagawa (JP); Masaaki Ishida, Kanagawa (JP); Atsufumi Omori, Kanagawa (JP); Muneaki Iwata, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 2 days.

This patent is subject to a terminal disclaimer.

(21) Appl. No.: 14/082,628

(22) Filed: Nov. 18, 2013

(65) Prior Publication Data
US 2014/0139605 A1    May 22, 2014

(30) Foreign Application Priority Data

Nov. 21, 2012  (JP) .................................. 2012-255469
Nov. 21, 2012  (JP) .................................. 2012-255471

(51) Int. Cl.
*G03G 15/04*   (2006.01)
*G03G 15/00*   (2006.01)
(Continued)

(52) U.S. Cl.
CPC .............. *G03G 15/04* (2013.01); *G02B 26/127* (2013.01); *G03G 15/04054* (2013.01); *G03G 15/80* (2013.01); *H01S 5/0428* (2013.01)

(58) Field of Classification Search
CPC ..... G03G 15/04; G03G 15/043; G03G 15/80; G03G 2215/0404; G03G 15/04054; G02B 36/12; G02B 26/127; H01S 5/06; H01S 5/0428; B41J 2/40; B41J 2/44
USPC .......... 347/118, 132, 133, 236, 237, 246, 247
See application file for complete search history.

(56) References Cited

U.S. PATENT DOCUMENTS 6,222,862 B1 *  4/2001  Kinbara et al. ............ 372/38.04
6,791,596 B2    9/2004  Nihei et al.
(Continued)

FOREIGN PATENT DOCUMENTS

JP    3466599    11/2003
JP    3578596    10/2004
(Continued)

OTHER PUBLICATIONS

Chinese official action dated May 19, 2015 (and English translation thereof) in corresponding Chinese Patent Application No. 201310594615.7.

*Primary Examiner* — Manish S Shah
*Assistant Examiner* — Roger W Pisha, II
(74) *Attorney, Agent, or Firm* — Cooper & Dunham LLP

(57) ABSTRACT

A light source drive circuit for driving a light source is disclosed including a drive current generating unit generating a drive current, the drive current including a predetermined current for obtaining a predetermined light amount from the light source, a first auxiliary current input to the light source prior to input of the predetermined current, and a second auxiliary current added to the predetermined current in synchronization thereto; and a signal generating unit generating a first signal and a second signal, the first signal causing the first auxiliary current to be input for a first period and the second signal causing the second auxiliary current to be applied to the predetermined current for a second period. The first period is shorter than a period from a rise of the predetermined current to when a light amount from the light source reaches the predetermined light amount with the predetermined current.

6 Claims, 32 Drawing Sheets

(51) Int. Cl.
*G02B 26/12* (2006.01)
*H01S 5/042* (2006.01)

(56) References Cited

U.S. PATENT DOCUMENTS

| | | | |
|---|---|---|---|
| 6,917,639 B2 * | 7/2005 | Ishida et al. ............... 372/38.02 |
| 6,917,693 B1 | 7/2005 | Kiridena et al. |
| 6,933,957 B2 | 8/2005 | Omori et al. |
| 7,256,815 B2 | 8/2007 | Suzuki et al. |
| 7,271,824 B2 | 9/2007 | Omori et al. |
| 7,463,278 B2 | 12/2008 | Ozasa et al. |
| 7,515,170 B2 | 4/2009 | Omori et al. |
| 7,701,480 B2 * | 4/2010 | Omori et al. .................. 347/237 |
| 7,826,110 B2 | 11/2010 | Tanabe et al. |
| 7,903,135 B2 | 3/2011 | Ichii et al. |
| 7,920,305 B2 | 4/2011 | Ishida et al. |
| 7,936,367 B2 | 5/2011 | Ishida et al. |
| 7,936,493 B2 | 5/2011 | Ishida et al. |
| 7,995,251 B2 | 8/2011 | Tanabe et al. |
| 8,072,667 B2 | 12/2011 | Suzuki et al. |
| 8,089,665 B2 | 1/2012 | Omori et al. |
| 8,207,996 B2 | 6/2012 | Miyake et al. |
| 8,237,760 B2 | 8/2012 | Nihei et al. |
| 8,253,768 B2 | 8/2012 | Ishida et al. |
| 8,270,026 B2 | 9/2012 | Nihei et al. |
| 8,310,513 B2 | 11/2012 | Nihei et al. |
| 8,310,516 B2 | 11/2012 | Tanabe et al. |
| 8,446,444 B2 | 5/2013 | Ishida et al. |
| 8,896,648 B2 * | 11/2014 | Omori .................. G03G 15/043 347/130 |
| 2007/0030548 A1 | 2/2007 | Nihei et al. |
| 2007/0242127 A1 | 10/2007 | Omori et al. |
| 2008/0291259 A1 | 11/2008 | Nihei et al. |
| 2008/0298842 A1 | 12/2008 | Ishida et al. |
| 2010/0119262 A1 | 5/2010 | Omori et al. |
| 2011/0199657 A1 | 8/2011 | Ishida et al. |
| 2011/0228037 A1 | 9/2011 | Omori et al. |
| 2012/0099165 A1 | 4/2012 | Omori et al. |
| 2012/0189328 A1 | 7/2012 | Suzuki et al. |
| 2012/0293783 A1 | 11/2012 | Ishida et al. |
| 2014/0139603 A1 * | 5/2014 | Fujita et al. ................... 347/118 |

FOREIGN PATENT DOCUMENTS

| | | |
|---|---|---|
| JP | 2007-168332 | 7/2007 |
| JP | 4349470 | 10/2009 |

* cited by examiner

LIGHT SOURCE DRIVE CIRCUIT, OPTICAL SCANNING APPARATUS, AND IMAGE FORMING APPARATUS

BACKGROUND OF THE INVENTION

1. Field of the Invention

The present invention relates to a light source drive circuit, an optical scanning apparatus, and an image forming apparatus.

2. Description of the Related Art

In a related-art image forming apparatus for use in product printing, etc., a predetermined optical output is obtained from a light source such as an LD (laser diode), etc., to expose a photosensitive body therewith and express a density of an image.

Now, it is known that, in the related art, a light emission delay time occurs, which depends on a response characteristic of a light source before obtaining a predetermined optical output from the light source. Moreover, in the related art, it is known, for example, that, from a time at which a drive current is supplied to a light source to a time at which an optical output is detected, a light emission delay time occurs which depends on a parasitic capacitance of a circuit, etc., in which the light source is mounted.

Therefore, in the related-art image forming apparatus, when a time to cause an optical output is set to a short time of less than or equal to a few ns, for example, the optical output becomes less than a predetermined light amount, and the density of an image decreases, possibly causing unevenness in the image.

Thus, in the related art, schemes are provided to solve the above-described problems. For example, Patent document 1 discloses providing a charge and discharge circuit, wherein an overshoot current is generated by discharging at a time of a rise of an output of the LD (laser diode) to reduce a light emission delay time which depends on a response characteristic of a light source. Moreover, Patent document 2 discloses initially superposing a threshold current at a start time of lighting the to and controlling a light emission amount thereof. Furthermore, Patent document 3 discloses a method to output, prior to a drive current, a current over a current threshold of a light element for a shorter time period than a time period to output the drive current.

However, the overshoot current in Patent document 1 is generated primarily for reducing a delay time which depends on the response characteristic of the light source, so that it is difficult to improve the light emission delay time which depends on a parasitic capacitance. Moreover, in Patent document 2, while the threshold current is initially superposed at the start time of lighting the LD, the threshold current is insufficient for charging to overcome a circuit parasitic capacitance, so that it is difficult to sufficiently reduce a light emission delay time which depends on the parasitic capacitance. In particular, it becomes more difficult to reduce a delay time which depends on the parasitic capacitance in a circuit with a large parasitic capacitance and a light source with a large differential resistance. Furthermore, in the configuration disclosed in Patent Document 3, which supplies the current prior to the drive current, it may be difficult to optimize light output characteristics of the light source.

At least one embodiment of the present invention is aimed at resolving the above problem and providing a light source drive circuit, an optical scanning apparatus, and an image forming apparatus which make it possible to reduce a light emission delay time of an optical output and to improve a response characteristic.

SUMMARY OF THE INVENTION

In an aspect of this disclosure, there is provided a light source drive circuit for driving a light source, the light source drive circuit including a drive current generating unit configured to generate a drive current, the drive current including a predetermined current for obtaining a predetermined light amount from the light source, a first auxiliary drive current input to the light source prior to input of the predetermined current, and a second auxiliary drive current added to the predetermined current in synchronization thereto; and a signal generating unit configured to generate a first signal and a second signal, the first signal causing the first auxiliary drive current to be input for a first period and the second signal causing the second auxiliary drive current to be applied to the predetermined current for a second period, wherein the first period is configured to be shorter than a period from a rise of the predetermined current to when a light amount from the light source reaches the predetermined light amount with the predetermined current.

According to another embodiment of this invention, there is provided an optical scanning apparatus, the optical scanning apparatus including a light source; a reflecting mirror configured to cause a light irradiated from the light source to be reflected; and the above-stated light source drive circuit.

According to another embodiment of this invention, there is provided an image forming apparatus, the image forming apparatus including a light source; a reflecting mirror configured to cause a light irradiated from the light source to be reflected; a photosensitive body configured to be scanned by a reflected light which is reflected by the reflecting mirror; and the above-stated light source drive circuit.

According to another embodiment of this invention, there is provided a light source drive circuit for driving a light source, the light source drive circuit including a drive current generating unit configured to generate a drive current, the drive current including a predetermined current for obtaining a predetermined light amount from the light source and an auxiliary drive current input to the Light source prior to input of the predetermined current; and a signal generating unit configured to cause the auxiliary drive current to be input for a predetermined period, wherein the predetermined period is configured to be shorter than a period from a rise of the predetermined current to when a light amount from the light source reaches the predetermined light amount with the predetermined current.

According to another embodiment of this invention, there is provided an optical scanning apparatus, the optical scanning apparatus including a light source; a reflecting mirror configured to cause a light irradiated from the light source to be reflected; and the above-stated light source drive circuit.

According to another embodiment of this invention, there is provided an image forming apparatus, the image forming apparatus including a light source; a reflecting mirror configured to cause a light irradiated from the light source to be reflected; a photosensitive body configured to be scanned by a reflected light which is reflected by the reflecting mirror; and the light source drive circuit.

At least one embodiment of the invention makes it possible to reduce a light emission delay time of an optical output and to improve a response characteristic.

BRIEF DESCRIPTION OF THE DRAWINGS

Other objects and further features of embodiments may become apparent from the following detailed description when read in conjunction with the accompanying drawings, in which.

DESCRIPTION OF THE PREFERRED EMBODIMENTS

Figure 1:
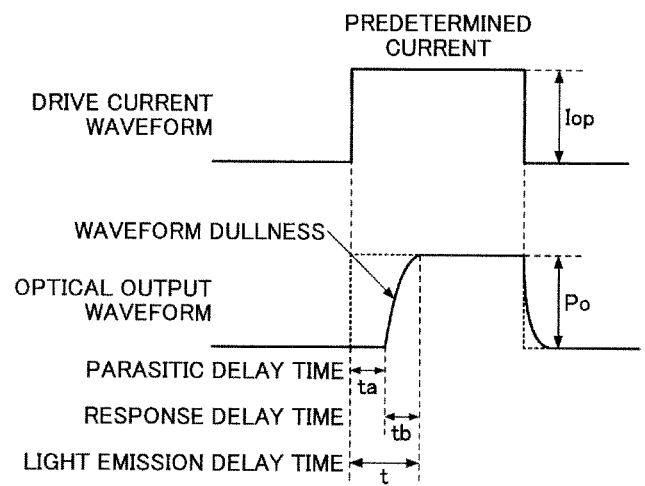
FIG. 1 is a view for explaining a light emission delay time of a light source.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

At least one embodiment of the present invention applies an auxiliary drive current (hereinafter called "pre-charging current") prior to applying a predetermined current normally used for driving a light source, thereby decreasing a light emission delay time (hereinafter called "parasitic delay time") and improving response characteristics of light output of the light source.

Below, embodiments of the present invention are described using the drawings.

FIG. 1 is a view for explaining a light emission delay time of a light source. FIG. 1 shows a drive current waveform supplied to a light source; and an optical output waveform of the light source to which the drive current is supplied. In FIG. 1, an output of the light source is shown in a light amount.

A light emission delay time t shown in FIG. 1 shows a time from when supplying of the drive current to the light source is started to when the light source outputs a predetermined light amount Po. The predetermined light amount to is a target light amount set in advance. The light emission delay time t is a sum of a parasitic delay time ta and a response delay time tb. The parasitic delay time ta is a charging time to overcome a parasitic capacitance produced in parallel with a light source that is present in a wiring which connects the light source and a circuit, or an in-package wiring of the light source. Details of the parasitic delay time ta are described below. As a charge amount and the charging time increase as the parasitic capacitance increases, the parasitic delay time ta tends to increase accordingly.

The response delay time tb is a response time from when the light source starts light emission with a predetermined current Iop being supplied to the light source to when the predetermined light amount Po is output. The predetermined current Iop is a current whose value is set in advance for obtaining the predetermined light amount Po. The response delay time tb results from a characteristic of the light source and has an impact due to a differential resistance, for example. The larger the differential resistance the more difficult it becomes for a current to flow into the light source, so that the response delay time tb tends to increase accordingly.

In practice, the light emission delay time t, which is up to when the drive current is supplied to the light source, includes a wiring delay time, etc., on a circuit board, other than the parasitic delay time ta and the response relay time tb. However, in the description of the present specification, the wiring delay time, etc., is ignored, so that the light emission delay time t is set to be a sum of the parasitic delay time ta and the response delay time tb. Moreover, in the description of the present specification, respective falls of the drive current waveform and the optical output waveform are shown to be aligned.

Figure 2:
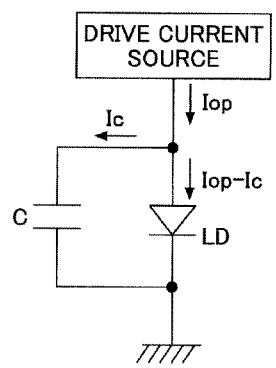
FIG. 2 is a view for explaining a parasitic capacitance of the light source.

Below, the parasitic capacitance is explained with reference to FIG. 2. FIG. 2 is a view for explaining the parasitic capacitance of the light source.

In the present embodiment, the light source is set to be an LD (laser diode), for example. In the LD shown in FIG. 2, when a predetermined current Iop is supplied, a predetermined light amount Po is output. C shown in FIG. 2 is a parasitic capacitance. The parasitic capacitance C includes a parasitic capacitance which is produced when the LD is mounted on a circuit substrate, etc., together with a circuit such as an LD driver, etc., in a wiring which connects the LD and the circuit such as the LD driver, etc. Moreover, when the LD and the circuit including the LD driver, etc., are integrated into a package, the parasitic capacitance C also includes a parasitic capacitance of the package, etc.

When the predetermined current Iop is supplied to the LD, a current Ic, which is a portion of the predetermined current Iop, is supplied to charge the circuit to overcome the parasitic capacitance C. While the circuit is being charged by the current Ic, a current (Iop-Ic), which is a portion of the predetermined current Iop, is supplied to the LD. Then, when charging of the circuit with parasitic capacitance C is completed, the entire predetermined current Iop is supplied to the LD. In other words, during the time of charging the circuit by the current Ic, only the portion (Iop-Ic) of the predetermined current Iop is supplied to the LD, so that it becomes a time during which no optical output is obtained. This time during which no optical output is obtained becomes a parasitic delay time.

Figure 3:
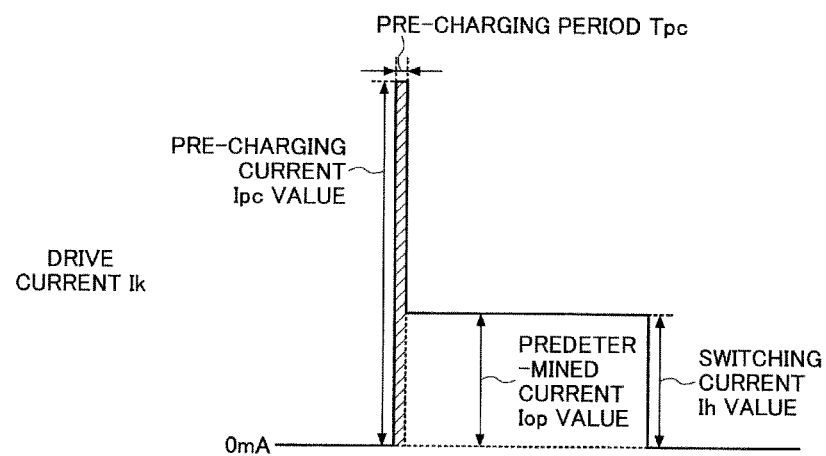
FIG. 3 is a view for explaining a drive current which is supplied to the light source from a light source drive circuit.

Next, a drive current Ik which is supplied to the light source from a light source drive circuit according to the present invention is described with reference to FIG. 3. FIG. 3 is a view for explaining the drive current which is supplied to the light source from the light source drive circuit. FIG. 3 shows a drive current waveform supplied to the light source from the light source drive circuit.

The drive current Ik supplied to the light source includes the predetermined current Iop for obtaining the predetermined light amount Po and a pre-charging current Ipc input for a predetermined period prior to the predetermined current Iop. Here, the predetermined current Iop value equals a switching current Ih value.

The pre-charging current Ipc may be configured based on a parasitic delay time. The parasitic delay time may be calculated depending on a circuit board implementing the light source. Thus, the pre-charging current Ipc value and a duration time for applying the pre-charging current Ipc may be determined and fixed according to the parasitic delay time which has been calculated. In this embodiment, a pre-charging period Tpc is shorter than the parasitic delay time. In other words, the pre-charging period Tpc is shorter than a time period from the time when supply of the predetermined current Iop is started for the light source to the time when the light source starts to emit the light. A configuration method for the pre-charging period Tpc and the pre-charging current Ipc value is discussed later.

As shown in FIG. 3, the drive current Ik including the pre-charging current Ipc may be supplied for the light source and the parasitic delay time may be decreased.

First Embodiment

A description is given below with regard to a first embodiment of the present invention with reference to the drawings.

Figure 4:
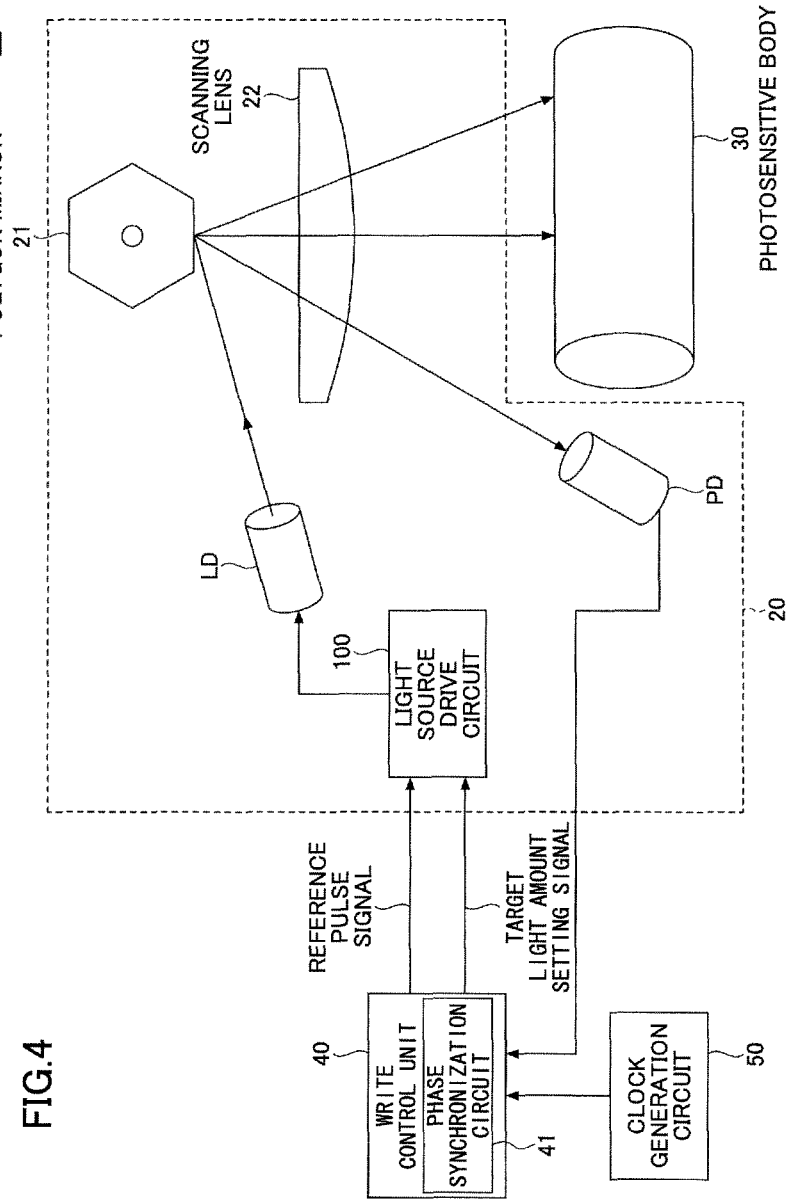
FIG. 4 is a diagram for explaining a schematic configuration of an image forming apparatus according to a first embodiment.

FIG. 4 is a diagram for explaining a schematic configuration of an image forming apparatus according to the first embodiment.

An image forming apparatus 10 according to the present embodiment includes an optical scanning apparatus 20; a photosensitive body 30; a write control unit 40; and a clock generation circuit 50.

The optical scanning apparatus 20 according to the present embodiment includes a polygon mirror 21; a scanning lens 22; a light source drive circuit 100, an LD (laser diode; a semiconductor laser) which is a light emitting element (light source); and a PD (photo detector) to be a light receiving element. While the light source is set to be the LD according to the present embodiment, it is not limited thereto. The light source may be a semiconductor laser array (LDA; laser diode array), a VCSEL (vertical cavity surface emitting laser), etc.

A laser light which is emitted from the LD is reflected by the rotating polygon mirror 21 and irradiated onto the photosensitive body 30, which is a medium to be scanned, via the scanning lens 22. The laser light which is irradiated becomes a scanning light spot on the photosensitive body 30, thereby forming an electrostatic latent image on the photosensitive body 30. Moreover, the polygon mirror 21 irradiates, onto the PD, the laser light each time scanning of one line is completed. When the laser light is irradiated thereon, the PD converts the irradiated laser light into an electrical signal and inputs this electrical signal into a phase synchronization circuit 41 included in the write control unit 40. When the electrical signal is input therein, the phase synchronization circuit 41 generates a pixel clock corresponding to the following line. Moreover, a high-frequency clock signal is input from the clock generation circuit 50 into the phase synchronization circuit 41, thereby achieving phase synchronization of the pixel clock.

The write control unit 40 supplies a reference pulse signal to the light source drive circuit 100 in accordance with the pixel clock generated. Moreover, the write control unit 40 supplies a target light amount setting signal to the light source drive circuit 100, driving the LD. In this way, an electrostatic latent image of image data is formed on the photosensitive body 30.

Figure 5:
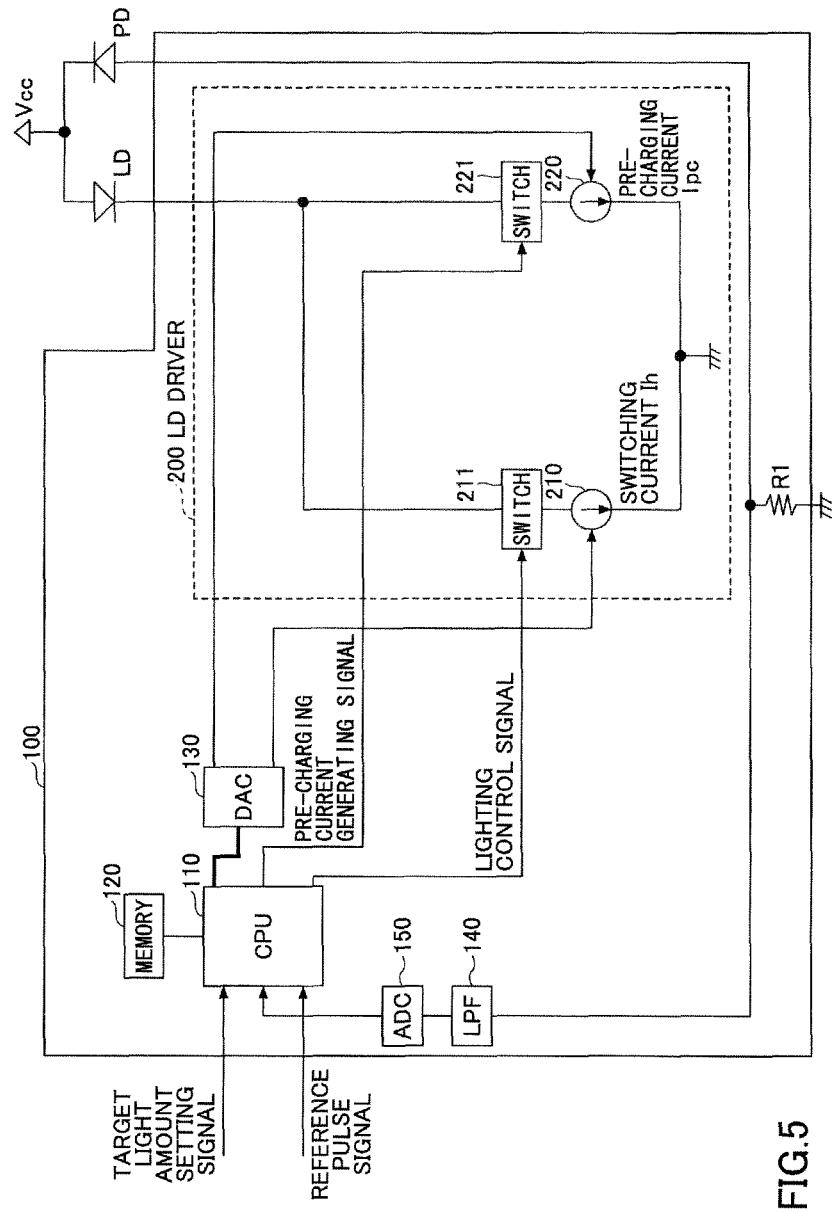
FIG. 5 is a diagram for explaining the light source drive circuit according to the first embodiment.

Below the light source drive circuit 100 of the present embodiment is explained with reference to FIG. 5.

The light source drive circuit 100 according to the present embodiment includes a CPU (central processing unit) 110; a memory 120; a DAC (digital to analog converter) 130; an LPF (low-pass filter) 140; an ADC (analog to digital converter) 150; an LD driver 200; and a resistor R1. The resistor R1 does not have to be included in the light source drive circuit 100. In this case, the resistor R1 is connected to around the light source drive circuit 100.

The light source drive circuit 100 according to the present embodiment that is connected between the LD and the PD, controls driving of the LD based on the electrical signal output from the PD in accordance with a received light amount of the PD.

The CPU 110 controls various operations of the light source drive circuit 100. The memory 120 stores various values, etc., for use in the operations of the light source drive circuit 100. Details of the values stored in the memory 120 and functions of the CPU 110 are described below.

The DAC 130 converts a signal output from the CPU 110 into analog values. The LPF 140 passes a signal of a predetermined band out of electrical signals output from the PD. The ADC 150 converts the electrical signal output from the LPF 140 into digital values.

The LD driver 200 generates the drive current Ik to be supplied to the LD based on the reference pulse signal and the target light amount setting signal and controls a light emission timing of the LD. Prior to input of the predetermined current normally supplied for driving the LD, the LD driver 200 in this embodiment may apply the pre-configured pre-charging current.

The light source drive circuit 100 in this embodiment may control the drive current Ik by using the CPU 110 and the LD driver 200. In particular, the light source drive circuit 100 may generate a drive current waveform using the pre-configured pre-charging current Ipc synchronized with the reference pulse signal.

The LD driver 200 in this embodiment is described below. The LD Driver 200 has a switching current source 210, a pre-charging current source 220, and switches 211, 221.

The switching current source 210 and the pre-charging current source 220 generate the drive current Ik of the LD. In this embodiment, the drive current Ik is calculated as a sum of current values output from the current sources.

The switching current source 210 generates the predetermined switching current Ih responding to the lighting control signal from the CPU 110. The switching current source 210 is connected to the LD via the switch 211. The switch 211 may be configured using a transistor, for example. The switch 211 turns on and off in response to a pre-charging current generating signal supplied from the CPU 110. A value of the switching current Ih is set according to an instruction from the CPU 110.

The pre-charging current source 220 may generate the pre-charging current Ipc as an auxiliary drive current which aids the LD's driving. The pre-charging current source 220 is connected to the LD via the switch 221. The switch 221 may be a transistor, for example. The switch 221 turns on or off in response to a pre-charging current generating signal supplied from the CPU 110. In this embodiment, the pre-charging period Tpc refers to a period during the pre-charging current generating signal is on. In particular, the switch 221 in this embodiment is turned on at the time when the reference pulse signal is received and kept on for the pre-charging period Tpc.

Figure 6:
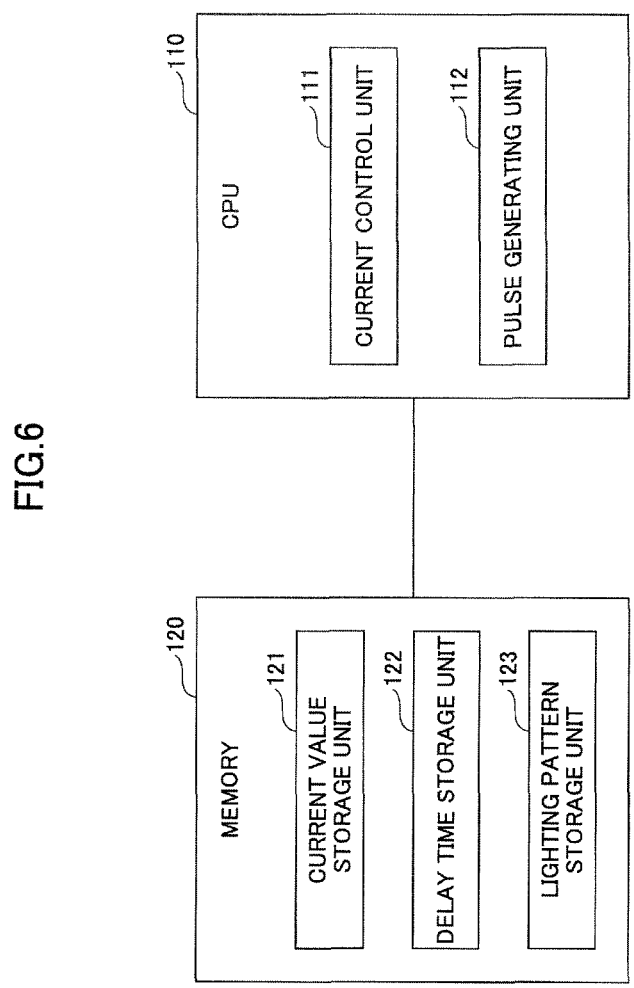
FIG. 6 is a diagram for explaining values stored in a memory and a functional configuration of a CPU.

With reference to FIG. 6, functions of the CPU 110 and values stored in the memory 120 are explained. FIG. 6 shows a configuration of functions of the CPU 110 and the values stored in the memory 120.

The CPU 110 in this embodiment has a current control unit 111 and a pulse generating unit 112.

The memory 120 has a current value storage unit 121, a delay time storage unit 122, and a lighting pattern storage unit 123. The current value storage unit 121 stores setting values for current sources of the light source drive circuit 100. In particular, the current value storage unit 121 has values for the switching current Ih and the pre-charging current Ipc.

The delay time storage unit 122 stores a delay time to determine the pre-charging period Tpc. The lighting pattern storage unit 123 stores a lighting pattern signal for the LD which is used when the Ipc value setting unit 330 (details are discussed later) calculates the pre-charging current Ipc.

The current control unit 111 in the CPU 110 obtains the setting values for the current sources which are stored in the current value storage unit 122 and causes the current sources to output currents in response to the setting values via the DAC 130.

The pulse generating unit 112 generates the pre-charging current generating signal based on the delay time stored in the delay time storage unit 122 and the reference pulse signal. When the image forming apparatus 10 is forming images, the switch 211 is turned on and off in response to the lighting control signal based on data of the images supplied from the write control unit 40.

Figure 7:
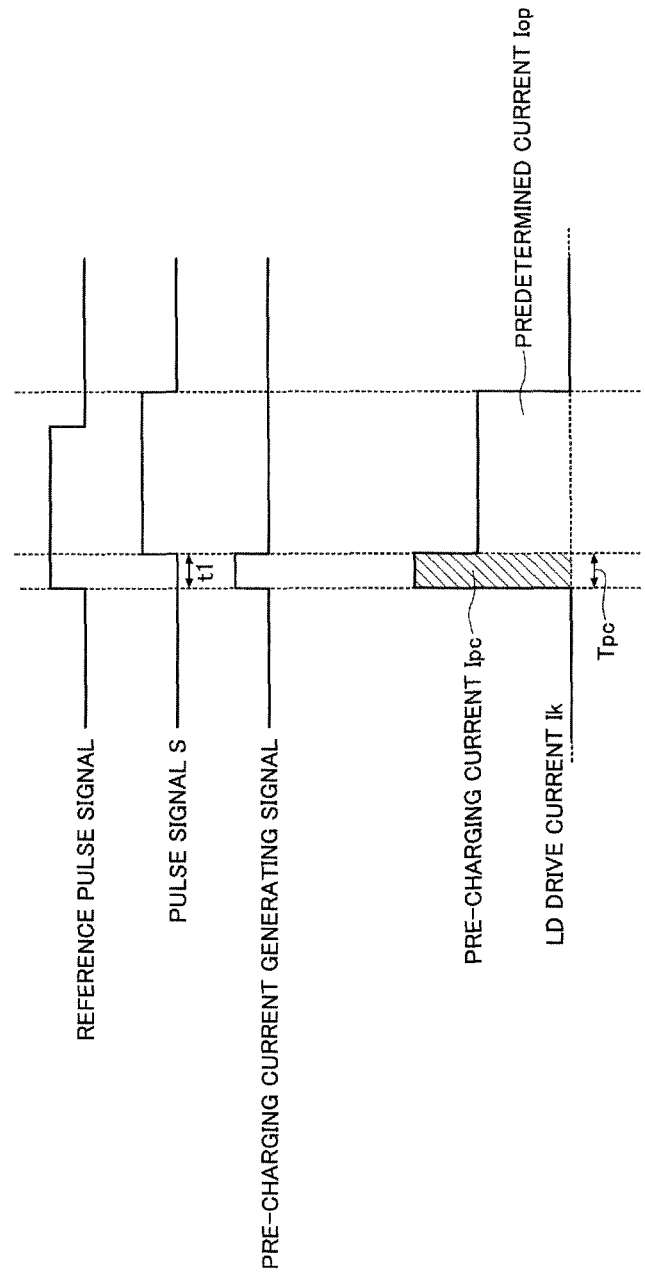
FIG. 7 is a diagram for explaining generation of a pre-charging current generating signal.

With reference to FIG. 7, it is explained how the pulse generating unit 112 generates the pre-charging current generating signal.

The pulse generating unit 112 in this embodiment obtains from the delay time storage unit 122 a delay time t1 corresponding to the pre-charging period Tpc. The pulse generating unit 112 generates a pulse signal S by delaying the reference pulse signal by t1. The pulse generating unit 112 generates the pre-charging current generating signal which is on (i.e. high level) for the pre-charging period Tpc using the reference pulse signal and the pulse signal S. Here, the pulse generating unit 112 generates the pre-charging current generating signal so that the pre-charging current generating signal is high when the reference pulse signal is high and the pulse signal S is low.

The pulse generating unit 112 in this embodiment stores the delay time t1 in the memory 120; however, it is not limited to the embodiment. The delay time t1 in this embodiment may be obtained by means other than the above stated example. For example, the pulse generating unit 112 in this embodiment may generate the pulse signal S by using an inverter or buffer column. Alternatively, the pulse generating unit 112 may generate the pulse signal S by delaying the reference pulse signal using a low pass filter including a resistance unit and a condenser and then forming the waveform. It is easy to change the amount of delay by modifying the number of columns or the constant number of the filter.

Figure 8:
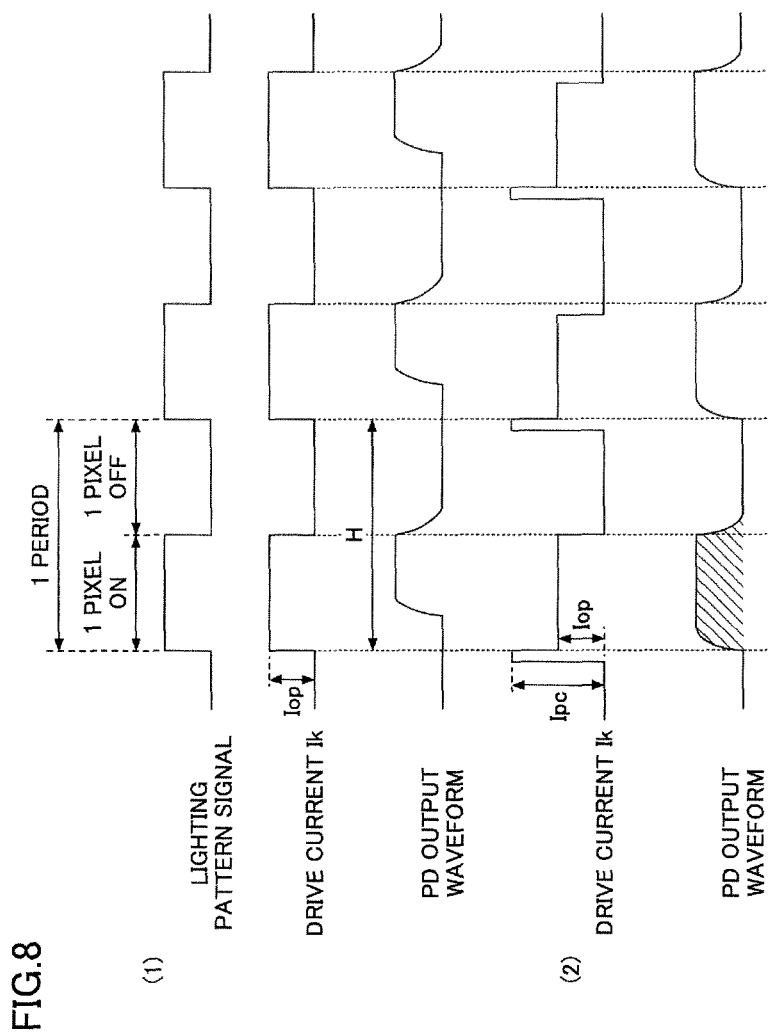
FIG. 8 is a drawing for explaining relationships of a drive current and an optical output waveform.

FIG. 8 (1) shows the drive current Ik supplied as synchronized with the lighting pattern signal which turns on the LD and a PD output waveform derived from the drive current Ik. As shown in FIG. 8 (1), the parasitic delay time exists because the drive current is used for charging to overcome the parasitic capacitance.

FIG. 8 (2) shows the pre-charging current supplied as synchronized with the pre-charging current generating signal explained in FIG. 7; the drive current Ik generated from the predetermined current supplied as synchronized with the pulse signal S; and a PD output waveform derived from the drive current Ik. As shown in FIG. 8 (2), the parasitic delay time decreases because the pre-charging current supplied prior to the predetermined current is used for charging to overcome the parasitic capacitance.

Below, calculation of the value of the pre-charging current Ipc and the pre-charging period Tpc by the evaluation apparatus connected to the light source drive circuit 100 is explained.

Figure 9:
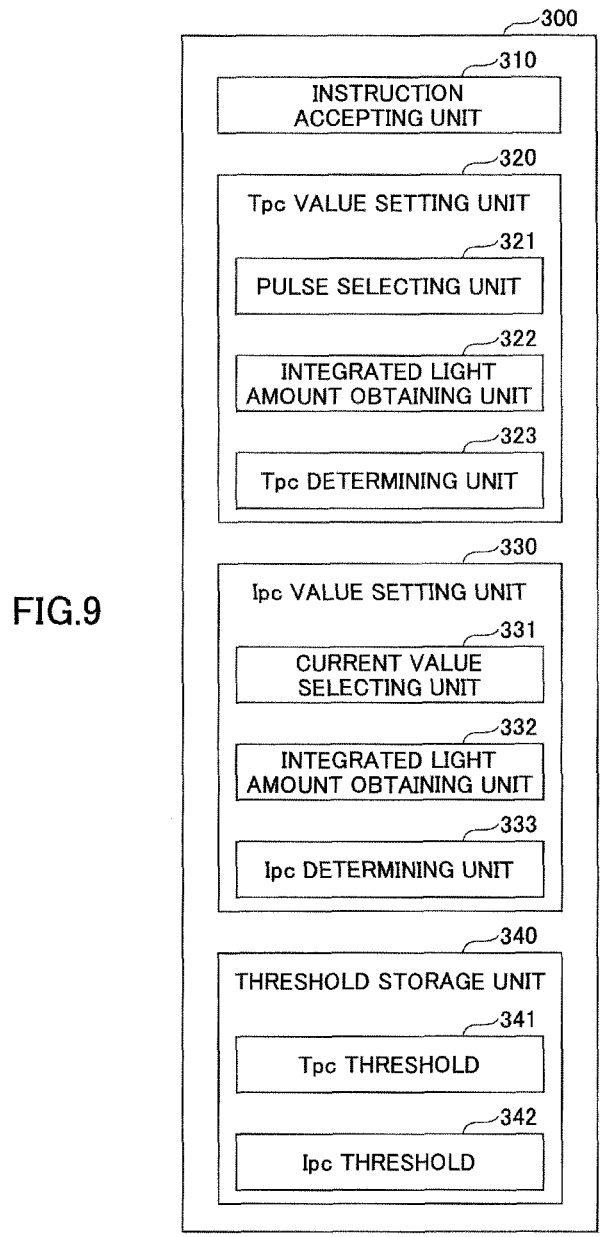
FIG. 9 is a diagram illustrating an example of a functional configuration of an evaluation apparatus connected to the light source drive circuit.

FIG. 9 is a diagram illustrating an example of a functional configuration of an evaluation apparatus 300 connected to the light source drive circuit. According to the present embodiment, the evaluation apparatus 300 may be connected between the output side of the ADC 150 and the input side of the CPU 110, for example.

The evaluation apparatus 300 is a computer which includes an arithmetic processing unit and a storage unit, for example. The evaluation apparatus 300 includes an instruction accepting unit 310, a Tpc value setting unit 320, an Ipc value setting unit 330, and a threshold storage unit 340.

The instruction accepting unit 310 accepts setting instructions for the pre-charging period Tpc and the pre-charging current Ipc. According to the present embodiment, it may be assumed that, for example, the evaluation apparatus 300 has accepted the setting instructions when it is connected to the light source drive circuit 100. Moreover, when the setting instructions are input by an evaluator who uses the evaluation apparatus 300, for example, the evaluation apparatus 300 may accept them.

The Tpc value setting unit 320, which includes a pulse selecting unit 321, an integrated light amount obtaining unit 322, and a Tpc determining unit 323, calculates and sets the pre-charging period Tpc.

The Ipc value setting unit 330, which includes a current value selecting unit 331, an integrated light amount obtaining unit 332, and an Ipc determining unit 333, calculates and sets a value of the pre-charging current Ipc.

In the threshold storage unit 340 are stored a Tpc threshold 341 which is used in the Tpc value setting unit 320 and an Ipc threshold 342 which is used in the Ipc value setting unit 330.

The Tpc threshold 311 is a threshold for determining whether light emission of the LD has been detected. The Ipc threshold 342 is a threshold for determining whether a light amount of the LD has reached a predetermined light amount. Details of processes of the Tpc value setting unit 320 and the Ipc value setting unit 330 will be described below.

Figure 10:
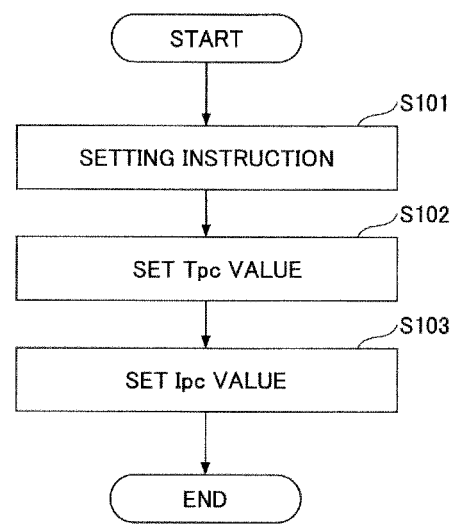
FIG. 10 is a flowchart for explaining setting of values of a pre-charging period Tpc and a pre-charging current Ipc by the evaluation apparatus.

Below, setting the value of the pre-charging current Ipc and the pre-charging period Tpc by the evaluation apparatus 300 according to the present embodiment is explained with reference to FIG. 10. FIG. 10 is a flowchart for explaining setting the value of the pre-charging current Ipc and the pre-charging period Tpc by the evaluation apparatus.

When setting instructions are accepted by the instruction accepting unit 310 (step S101), first the pre-charging period Tpc is set by the Tpc value setting unit 320 (step S102). Then, the evaluation apparatus 300 sets a value of the pre-charging current Ipc by the Ipc value setting unit 330 (step S103).

In this way, in the present embodiment, first the pre-charging period Tpc is set and then the value of the pre-charging current Ipc is set.

Figure 11:
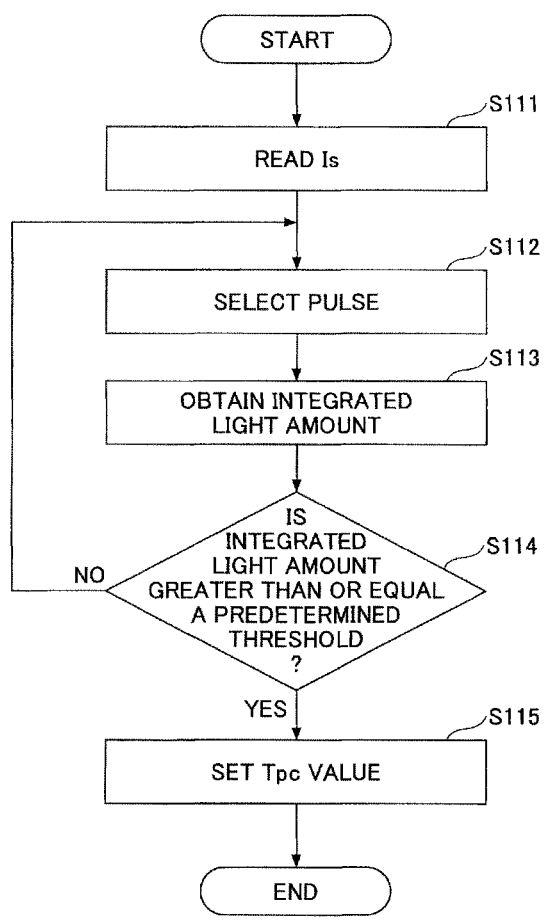
FIG. 11 is a flowchart for explaining a process of a Tpc value setting unit in the evaluation apparatus.

Next, setting the pre-charging period Tpc according to the Tpc value setting unit 320 is explained with reference to FIG. 11. FIG. 11 is a flowchart for explaining a process of the Tpc value setting unit in the evaluation apparatus.

According to the present embodiment, a time from when supplying to the LD a current larger than the predetermined current Iop is started to when light emission of the LD is detected is set as the pre-charging period Tpc.

According to the present embodiment, it is preferable to set the pre-charging period Tpc to a shorter period. The pre-charging period Tpc may be shortened to make it possible to charge the circuit to overcome the parasitic capacitance C in a short time and to reduce a parasitic delay time.

According to the present embodiment, a current larger than the predetermined current Iop supplied to the LD when the pre-charging period Tpc is set is called a "Tpc setting current" Is. The Tpc setting current Is is stored within a storage apparatus (not shown) included by the evaluation apparatus 300, for example. Moreover, the Tpc setting current Is may be stored in the memory 120 of the light source drive circuit 100, for example.

When the instruction accepting unit 310 in the evaluation apparatus 300 according to the present embodiment accepts setting instructions, the Tpc value setting unit 320 reads a Tpc setting current Is (Step S111). Next, the evaluation apparatus 300 causes the Tpc setting current Is to be output to the pre-charging current source 220 via the CPU 110 and the DAC 130 (step S112). Then, the switching current Ih is turned off, so that a current supplied to the LD is to be only a Tpc setting current Is which is output from the pre-charging current source 220.

Next, the Tpc value setting unit 320 outputs an instruction signal for selecting a pulse signal to the CPU 110 by the pulse selecting unit 321 (step S113). Then, the pulse selecting unit 321 causes selection of a pulse signal in an ascending order of a pulse width of the pulse signal to the CPU 110 in order to determine whether light emission of the LD has been detected. Details of the chosen pulse signal are discussed later.

When the pulse signal is selected in the CPU 110, the pulse signal selected is supplied to the switch 221 as the pre-charging current generating signal via the LD driver 200. The switch 221 according to the present embodiment is to be turned on during a period in which the pre-charging current generating signal is supplied. Therefore, when the switch 221 is turned on, the Tpc setting current Is is supplied to the LD.

Next, the integrated light amount obtaining unit 322 obtains, as a digital value via the ADC 150, an integrated light amount obtained by integrating a waveform of an electrical signal output from the PD based on a light amount of the LD by the LPF 140 (step S113).

Next, the Tpc determining unit 323 refers to the Tpc threshold 341 stored in the threshold storage unit 340 and determines whether the integrated light amount is greater than or equal to the Tpc threshold (step S114). In step S114, when the integrated light amount is greater than or equal to the Tpc threshold, the Tpc determining unit 323 determines that light emission of the LD has been detected, and a pulse width of a pulse signal selected just one previous to the pulse signal selected in step S112 is set as the pre-charging period Tpc. Here, the Tpc determining unit 323 saves the pre-charging period Tpc in the memory 120 via the CPU 110 (step S115).

When the integrated light amount is less than the Tpc threshold in step S114, the Tpc value setting unit 320 returns to step S112 and selects the next narrowest pulse signal.

Figure 12:
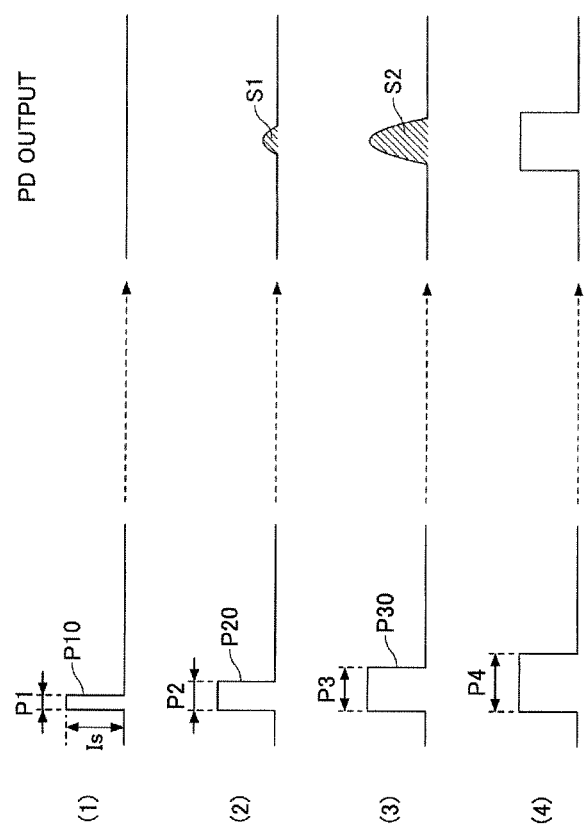
FIG. 12 is a diagram for explaining the pre-charging period Tpc.

FIG. 12 shows examples of pulse signals chosen by the CPU 110, which have different pulse widths. FIGS. 12(1)-(4) show output waveforms of the PD when pulse signals are selected in an ascending order of the pulse width thereof. The electrical signal output from the PD is converted to a voltage value by the resistor R1 so as to be supplied to the LPF 140.

FIG. 12 (1) shows an output waveform of the PD when a pulse signal P10 which is first selected in the CPU 110 is supplied to the LD. The pulse signal P10 is a signal with a narrowest pulse width out of pulse signals which can be selected by the CPU 110 and the pulse width is set to be P1. Here, an output of the PD is not manifested (i.e. no light emission occurs in the LD). Thus, the process in FIG. 11 goes to S112 after the execution of step S114 (i.e. via a branch of "NO").

FIG. 12 (2) shows an output waveform of the PD when a pulse signal 220 with a pulse width P2 is selected. Then, an output of the PD is slightly manifested, so that the integrated light amount is S1. Thus, the process in FIG. 11 goes to S112 after the execution of step S114 (i.e. via a branch of "NO") unless the S1 is equal to or more than the predetermined threshold (the Tpc threshold).

FIG. 12 (3) shows an output waveform of the PD when a pulse signal P30 with a pulse width P3 is selected. Then, an output of the PD is slightly manifested, so that the integrated light amount is S2.

In this way, it is assumed that light emission of the LD is detected when the pulse width of the pulse signal is gradually increased in this way, so that the integrated light amount of the output waveform of the PD becomes greater than or equal to a Tpc threshold.

The Tpc threshold is a proportion of an integrated light amount of an output waveform of the PD corresponding to light emission of the LD by the pulse signal relative to the integrated light amount (below-called the "total integrated light amount") of the output waveform of the PD when the LD outputs a predetermined light amount Po. For example, the Tpc threshold may be set to around a few % of the total integrated light amount. For example, provided that the Tpc threshold is set to 5%, when the integrated light amount of the output waveform of the PD reaches at least 5% of the total integrated light amount, it is determined that light emission occurs in the LD.

In FIG. 12, assuming that the integrated light amount S1 is around 3% of the total integrated light amount, and the integrated light amount S2 is around 10% of the total integrated light amount, the Tpc value setting unit 320 sets the pulse width P2 to the pre-charging period Tpc.

Now, a Tpc setting current Is which is supplied to the LD when setting the pre-charging period Tpc is explained with reference to FIG. 13.

Figure 13:
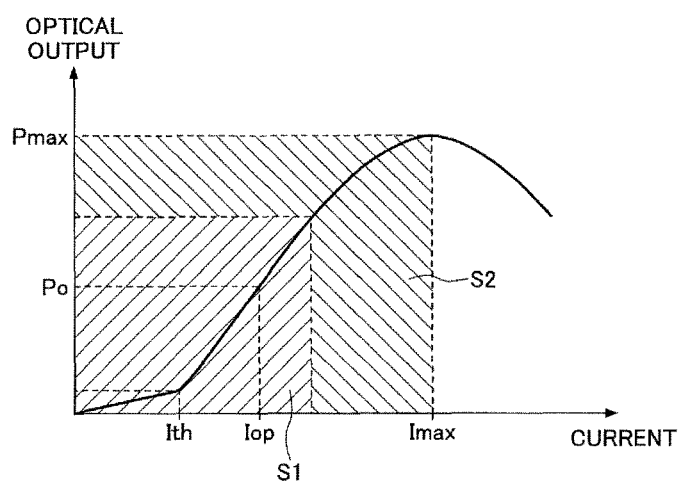
FIG. 13 is a diagram illustrating a current-optical output characteristic of an LD.

FIG. 13 is a diagram illustrating a current-optical output characteristic of the LD. In FIG. 13, a region S1 is a linear region in the current-optical output characteristic, while a region S2 is a non-linear region in the current-optical output characteristic.

A value of the Tpc setting current Is according to the present embodiment may be a value which is larger than a predetermined current Iop within the linear region S1 shown in FIG. 13 and less than or equal to a current Imax which corresponds to a maximum optical output Pmax in the non-linear region S2.

It is preferable in the present embodiment that light emission of the LD may be detected in a shorter time the larger is the Tpc setting current Is in the above-mentioned range, and the pre-charging period Tpc may be set to be a short time. Thus, for example, in the present embodiment, the Tpc setting current Is may be set to be the current Imax. More specifically, for example, in the present embodiment, a value of the Tpc setting current Is may be determined such that the pre-charging period Tpc becomes around 1 ns.

In this way, according to the present embodiment, a current which is larger than a predetermined current Iop for obtaining a predetermined light amount Po, which is set as a target light amount from the LD when setting the pre-charging period Tpc, is supplied to the LD, causing light emission of the LD to be detected in a short time. According to the present embodiment, even when a value of the Tpc setting current Is is set to be a value exceeding a rated current of the LD, the Tpc setting current Is is supplied to the LD during a period over which the LD does not break down.

Figure 14:
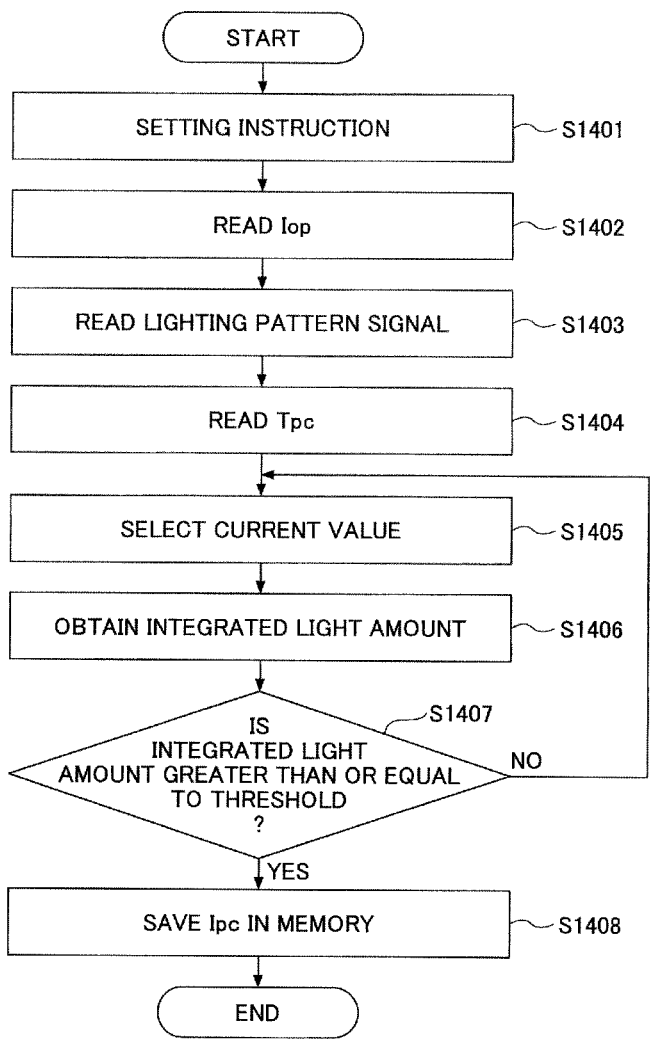
FIG. 14 is a flowchart for explaining a process of an Ipc value setting unit in the evaluation apparatus.

Next, setting of the pre-charging current Ipc by the Ipc value setting unit 330 of the evaluation apparatus 300 in the present embodiment is explained with reference to FIG. 14. FIG. 14 is a flowchart for explaining a process of the Ipc value setting unit 300 in the evaluation apparatus 300.

In the evaluation apparatus 300 of the present embodiment, when the instruction accepting unit 310 accepts a setting instruction (step S1401), the Ipc value setting unit 330 reads the predetermined current Iop (step S1402). The Ipc value setting unit 330 reads a lighting pattern signal from the memory 120 via the CPU 110 (step S1403). Next, the Ipc value setting unit 330 reads the pre-charging period Tpc (step S1404).

When the pre-charging period Tpc is read, the Ipc value setting unit 330 outputs a current value selecting signal for selecting a current value by the current value selecting unit 331 to the DAC 130 via the CPU 110 (step S1405). The current value selecting unit 331 selects a current value in an ascending order of the value thereof out of current values which can be output in the DAC 130.

When the current value selecting signal is received via the CPU 110, the DAC 130 converts the selected current value to an analog value to output the analog value to the pre-charging current source 220. The pre-charging current source 220 supplies the selected current value to the LD. Here, the pulse generating unit 112 supplies a pre-charging current generating signal which is synchronized with a rise of the lighting pattern signal to the switch 221. The pre-charging current generating signal turns on the switch 221 only for the pre-charging period Tpc read in step S1404.

Next, the Ipc value setting unit 330 obtains, by the integrated light amount obtaining unit 332, an integrated light amount of an output waveform of the PD that is output from the ADC 150 (step S1406). Next, the Ipc value setting unit 330, by the Ipc determining unit 333, refers to the threshold storage unit 340 and determines whether the obtained integrated light amount is greater than or equal to the Ipc threshold (step S1407).

In step S1407, when the integrated light amount is greater than or equal to the Ipc threshold, the Ipc value setting unit 330 sets the current value selected then to be a value of the pre-charging current Ipc and saves the set current value in the memory 120 via the CPU 110 (step S1408). In step S1407, when the integrated light amount is not greater than or equal to the Ipc threshold, the Ipc value setting unit 330 returns to step S1405, and selects the next largest current value.

As described above, according to the present embodiment, the evaluation apparatus 300 which is connected to the light source drive circuit 100 sets the value of the fixed pre-charging current Ipc and the pre-charging period Tpc and sets them to the light source drive circuit 100.

While the evaluation apparatus 300 is arranged to be connected to the outside of the light source drive circuit 100, it is not limited thereto. For example, in the light source drive circuit 100 according to the present embodiment, the CPU 110 may include functions included in the evaluation apparatus 300, for example. In this case, the light source drive circuit 100 may save the pre-charging period Tpc and the value of the pre-charging current Ipc in the memory 120 without using the evaluation apparatus 300.

Figure 15:
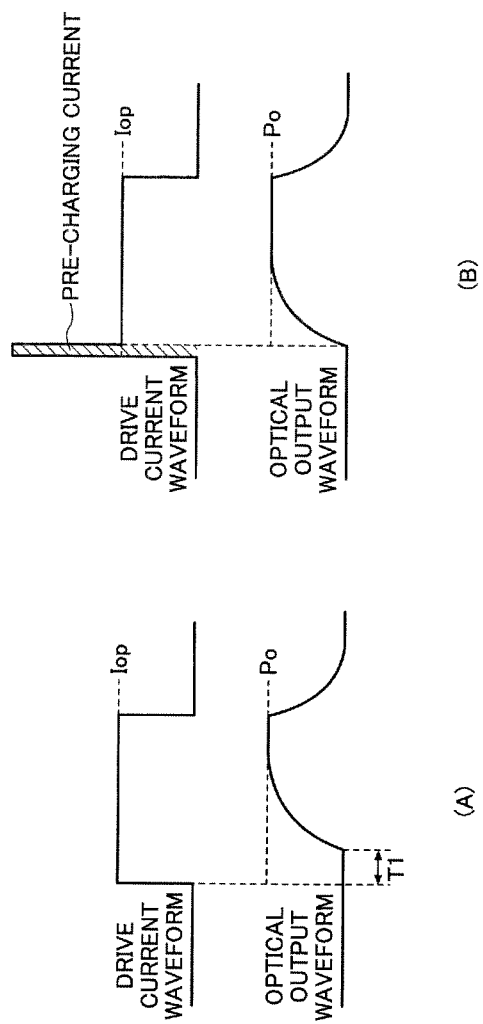
FIG. 15 is a diagram for explaining an advantageous effect of the first embodiment.

FIG. 15 shows the effect of the first embodiment.

FIG. 15(A) shows a drive current waveform and an optical output waveform when the predetermined current Iop is supplied for the LD. FIG. 15(B) shows a drive current waveform and an optical output waveform derived from this embodiment supplying the pre-charging current.

As shown in FIG. 15(A), the parasitic delay time T1 appears due to parasitic capacitance. The parasitic delay time indicates a time period from the beginning of the drive current supply for the light source to the output of the predetermined light volume Po from the light source. That makes the pulse width thin, and the required integrated light volume cannot be ensured.

The drive current waveform in this embodiment shown in FIG. 15(B) advantageously reduces the parasitic delay time because the pre-charging current Ipc which is supplied prior to the predetermined current Iop charges the circuit to overcome the parasitic capacitance in advance. In addition, by determining the pre-charging period Tpc and the pre-charging current Ipc properly using the evaluation apparatus 300 in this embodiment of the invention, the optical output waveform becomes similar to a square pulse and higher light volume may be ensured.

According to this embodiment, the delay of the light output may be reduced and its light characteristics may be improved.

Second Embodiment

Next, the second embodiment of the invention is described with reference to the drawings. The second embodiment differs from the first embodiment in that the drive current Ik includes a bias current Ib. In the description of the second embodiment, differences from the first embodiment are mainly discussed. In addition, the same reference numerals are given for the same components with the first embodiment, and explanations for them are not repeated.

Figure 16:
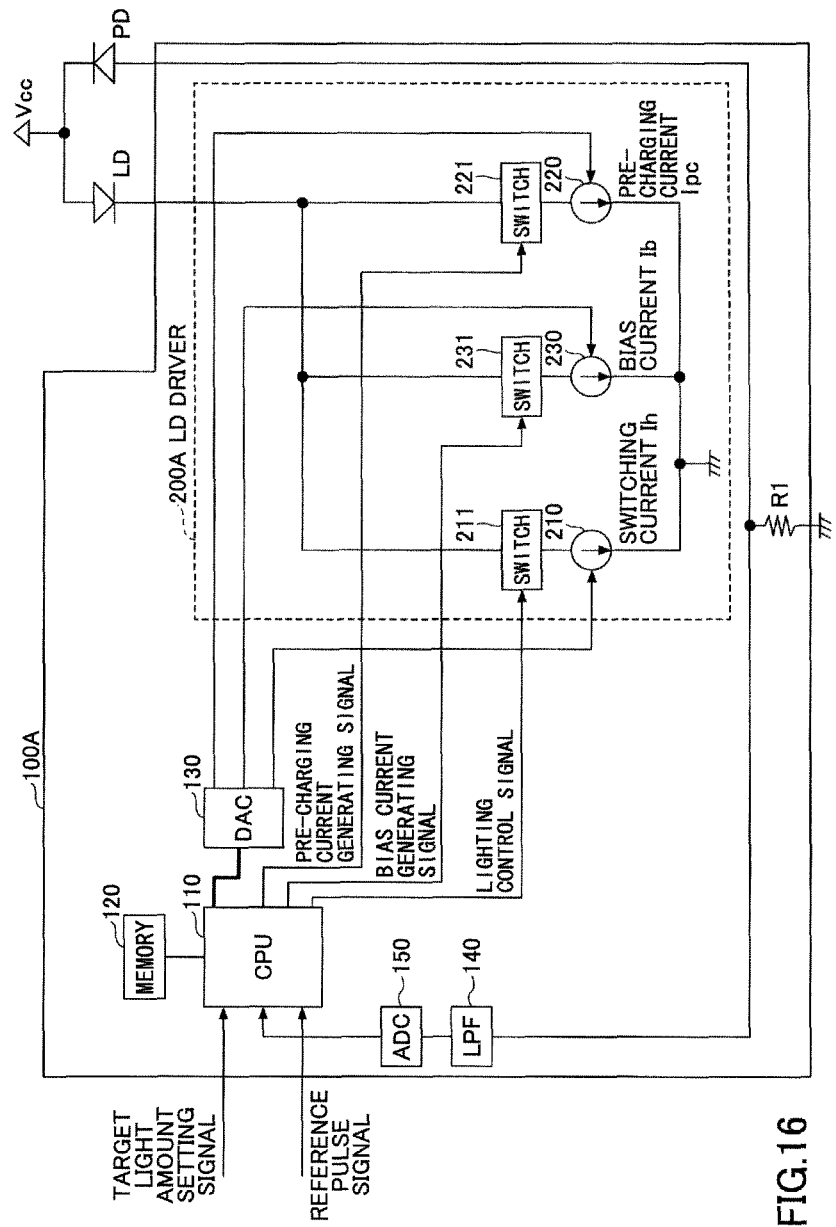
FIG. 16 is a diagram for explaining the light source drive circuit of a second embodiment.

FIG. 16 shows a light source drive circuit 100A in the second embodiment. The light source drive circuit 100A in this embodiment has a LD driver 200A. The LD driver 200A has a bias current source 230 and a switch 231.

The bias current source 230 generates the predetermined bias current Ib based on a bias current generating signal from the CPU 110. The bias current source 230 is connected to the LD via the switch 231. The switch 231 may be a transistor, for example. The switch 231 turns on and off in response to the bias current generating signal supplied from the CPU 110. A value of the bias current Ib is set according to an instruction from the CPU 110. The bias current Ib value may be stored in the current value storage unit 121 of the memory 120 shown in FIG. 6.

The LD driver 200A in this embodiment output currents from three current sources based on analog values supplied from a DAC 130 to generate the drive current Ik. In particular, the LD driver 200A in this embodiment generates the drive current Ik to which the pre-charging current Ipc is supplied prior to the beginning of the switching current Ih and supplies the drive current Ik for the LD.

Figure 17:
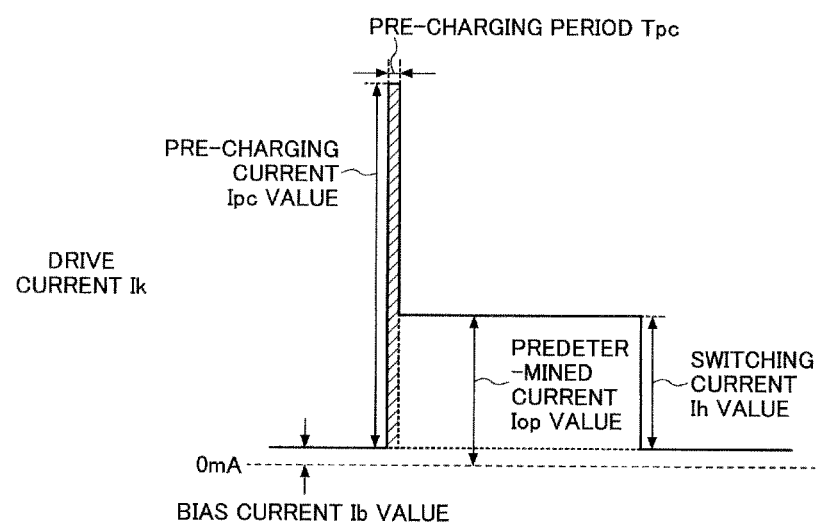
FIG. 17 is a diagram for explaining a drive current waveform of the second embodiment.

FIG. 17 shows a drive current waveform in the second embodiment.

As the drive current Ik includes the bias current Ib in this embodiment, the predetermined current Iop is a sum of the values of switching current Ih and the bias current Ib.

Third Embodiment

Next, the third embodiment of the invention is described with reference to the drawings. The third embodiment differs from the first embodiment in that the drive current Ik includes the bias current discussed as the second embodiment and an undershoot current. In the description of the third embodiment, differences from the second embodiment are mainly discussed. In addition, the same reference numerals are given for the same components with the second embodiment, and explanations for them are not repeated.

Figure 18:
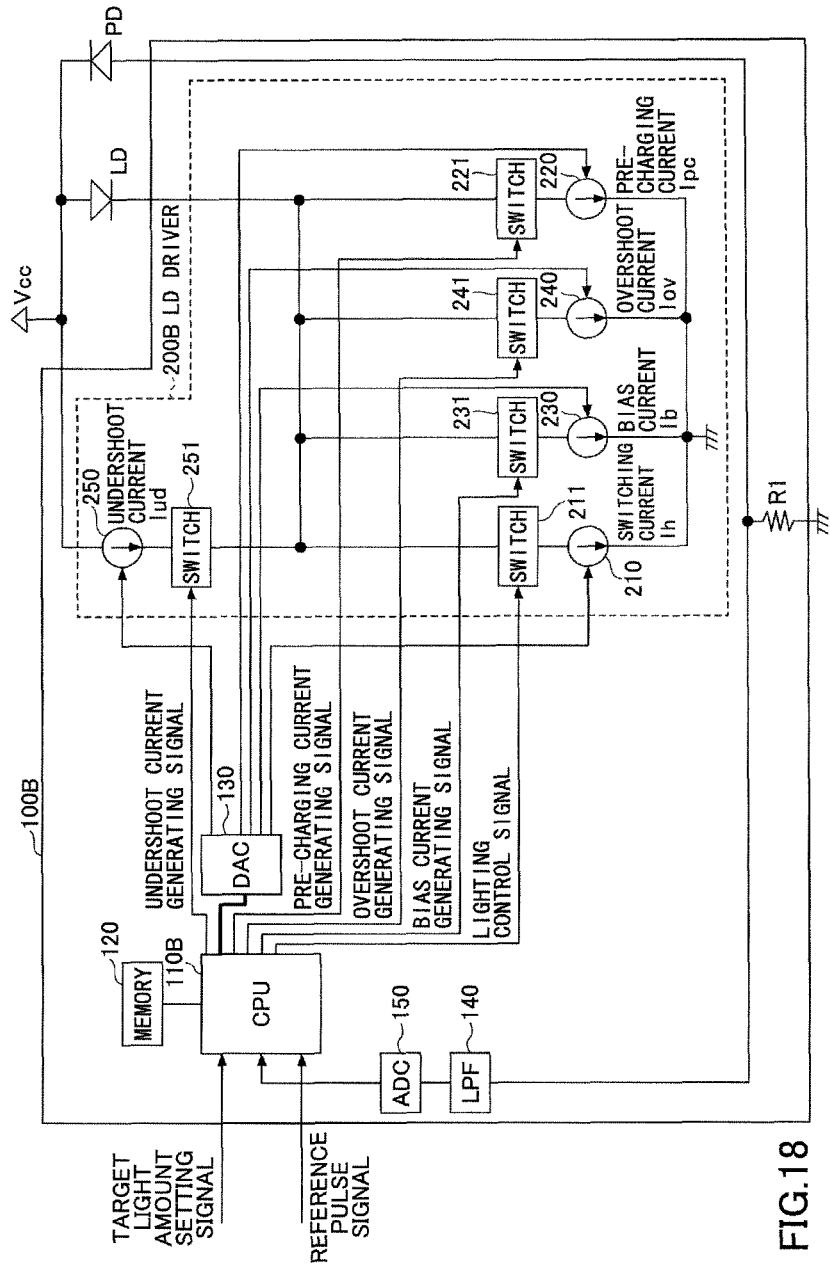
FIG. 18 is a diagram for explaining the light source drive circuit of a third embodiment.

FIG. 18 shows a light source drive circuit 100B in the third embodiment.

The light source drive circuit 100B in this embodiment has a CPU 110B and a LD driver 200B. The LD driver 200B has an overshoot current value source 240, an undershoot current source 250, and switches 241, 251.

A connection between the overshoot current source 240 and the LD is controlled by the switch 241. When the switch 241 is on, the overshoot current source 240 supplies an overshoot current by for the LD while the overshoot current Iov is synchronized with a rising of the switching current Ih. A connection between the undershoot current source 250 and the LD is controlled by the switch 251. When the switch 251 is on, the undershoot current source 250 supplies an undershoot current Iud for the LD while the undershoot current Iud is synchronized with a fall of the switching current Ih.

The switch 241 turns on and off in response to the overshoot current generating signal supplied from the CPU 110B. In particular, the switch 241 turns on while the overshoot current generating signal is high (hereinafter called "overshoot period Tov"). The switch 251 turns on and off in response to the undershoot current generating signal supplied from the CPU 110B. In particular, the switch 251 turns on while the undershoot current generating signal is high (hereinafter called "undershoot period Tud").

Values of the overshoot period Tov and the overshoot current Iov may be stored in the current value storage unit 121 of the memory 120 shown in FIG. 6 with the values of the pre-charging period Tpc and the pre-charging current Ipc. Also, the values of the overshoot period Tov and the overshoot current Iov may be calculated with any method.

Figure 19:
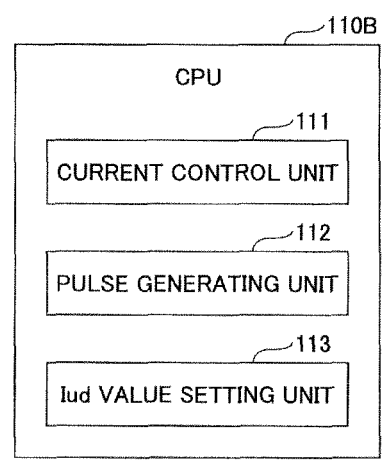
FIG. 19 is a diagram for explaining a functional configuration of the CPU of the third embodiment.

FIG. 19 shows a configuration of functions of the CPU 110B in the third embodiment. The CPU 110B in this embodiment has, in addition to the CPU 110 in the first embodiment, a Iud value setting unit 113.

The Iud value setting unit 113 in this embodiment refers to the memory 120 and calculates a sum of an amount of the pre-charging current Ipc and an amount of the overshoot current value Iov. The amount of the current is defined as the product of a current value and duration of time while a switch is on. In particular, the amount of the pre-charging current Ipc is the product of the pre-charging current Ipc value and the pre-charging period Tpc. The amount of the overshoot current Iov is the product of the overshoot current Iov value and the overshoot period Tov.

The Iud value setting unit 113 sets the undershoot current Iud value and the undershoot period Tud so that the product of them may equal to an amount of the undershoot current Iud.

The undershoot current Iud has a role to improve a dullness of the optical output waveform at a fall and discharge the previous charge that overcome the parasitic capacitance provided by the overshoot current value Iov. In this embodiment, response characteristics may be further improved by setting the amount of the undershoot current Iud which equals to a sum of the amount of the pre-charging current and the amount of the overshoot current value.

In this embodiment, the undershoot current Iud may be calculated quickly because complicated operations are not required due to the setting of the undershoot current Iud by using the pre-charging current Ipc and the overshoot current Iov.

Figure 20:
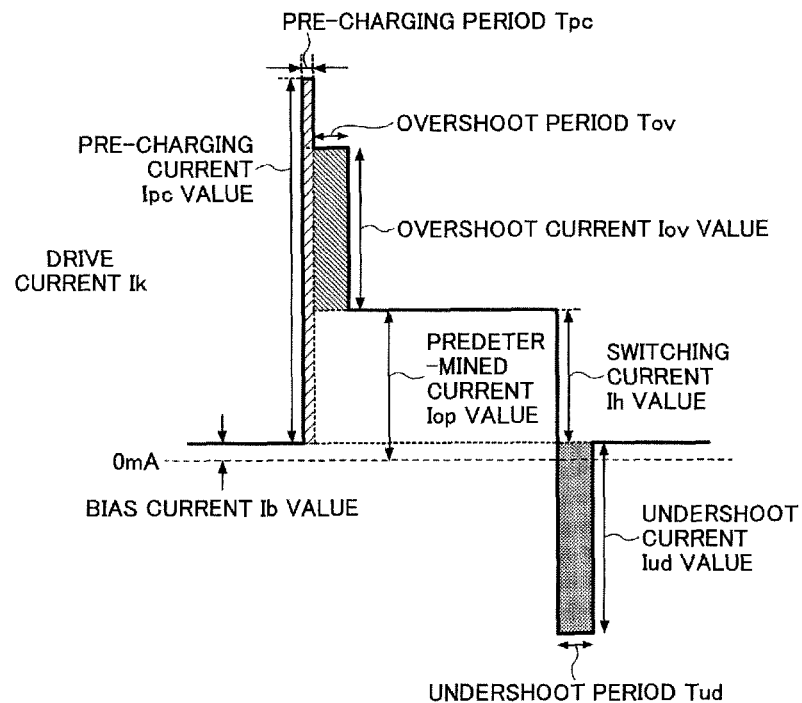
FIG. 20 is a diagram for explaining a drive current waveform of the third embodiment.

FIG. 20 shows a drive current waveform in the third embodiment.

The undershoot current Iud is supplied to the drive current Ik in this embodiment while the undershoot current Iud is synchronized with the fall of the predetermined current Iop in the first environment. The undershoot current Iud may improve a dullness of the optical output waveform at a fall and discharge the previous charge that overcome the parasitic capacitance.

Figure 21:
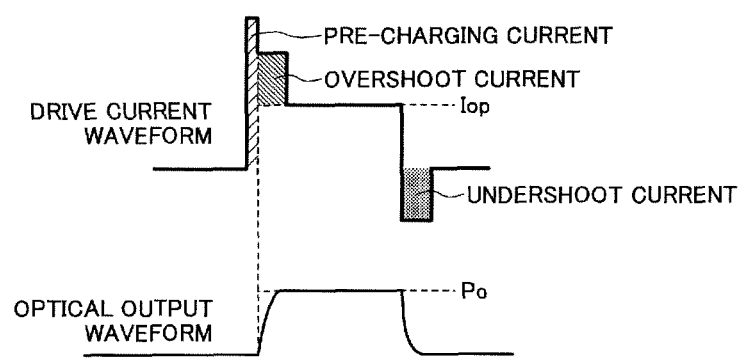
FIG. 21 is a diagram for explaining an advantageous effect of the third embodiment.

FIG. 21 shows the effect of the third embodiment. FIG. 21 corresponds to FIG. 15. FIG. 21 shows the drive current waveform derived from the drive current in this embodiment and the optical output waveform.

As shown in FIG. 21, the drive current waveform in this embodiment advantageously reduces the parasitic delay time due to the pre-charging current Ipc which is supplied prior to the predetermined current Iop as well as the delay of the waveform rising due to the overshoot current Iov. Furthermore, the delay of the waveform falling may be reduced due to the undershoot current Iud. As a result, the optical output waveform becomes similar to a square pulse and higher light volume may be ensured.

With reference to FIGS. 19-21, examples are explained about the drive current including the bias current, the overshoot current, and the undershoot current. However, any combination of these current man be used.

Fourth Embodiment

In this embodiment, a drive current is generated, which includes a fixed auxiliary drive current corresponding to the parasitic delay time depending on a circuit on which a light source is implemented; and an overshoot current which is controlled according to a light emission delay time depending on response characteristics of the light source. In this embodiment, the drive current supplied for the light source may reduce the parasitic delay time and the response delay time and improve response characteristics of the light output.

Figure 22:
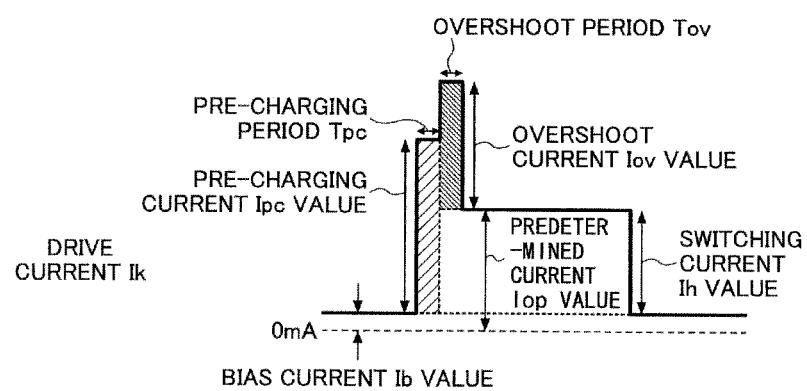
FIG. 22 is a view for explaining a drive current which is supplied to the light source from a light source drive circuit according to a fourth embodiment.

Next, the drive current which is supplied to the light source from the light source drive circuit in this embodiment is described with reference to FIG. 22. FIG. 22 is a view for explaining the drive current which is supplied to the light source from the light source drive circuit. FIG. 22 shows a drive current waveform supplied to the light source from the light source drive circuit.

The drive current Ik supplied to the light source includes a predetermined current Iop, an overshoot current Iov, and an auxiliary drive current (i.e. a pre-charging current) Ipc. The predetermined current Iop is used to obtain a predetermined light amount to from the light source. The predetermined current Iop includes a switching current Ih and a bias current Ib in an example shown in FIG. 22.

The overshoot current value Iov is superposed onto the predetermined current Iop in synchronization with a rise of the predetermined current Iop. The pre-charging drive current Ipc rises prior to the rise of the predetermined current Iop.

Again, the pre-charging current Ipc may be configured based on a parasitic delay time. The parasitic delay time may be calculated depending on a circuit board implementing the light source. Thus, the pre-charging current Ipc value and a duration time for applying the pre-charging current Ipc may be determined and fixed according to the parasitic delay time which has been calculated. In the present embodiment, the value of the pre-charging current Ipc is larger than the predetermined current Iop.

The value of the overshoot current Iov may be configured based on a response delay time. The response delay time depends on response characteristics of the light source. When the light source degrades, the response characteristics may vary. In addition, the response characteristics may differ depending on the production date of the light source. Thus, in the present embodiment, the value of the overshoot current Iov may be adjusted depending on the response characteristics of the light source. The duration time to supply the overshoot current value Iov is fixed.

In the present embodiment, by generating the drive current Ik shown in FIG. 22 and supplying the drive current Ik to the light source, the parasitic delay time is reduced due to the pre-charging current Ipc and the response delay time is reduced due to the overshoot current value Iov. In addition, since the pre-charging current Ipc is fixed and only the overshoot current value Iov may be varied, it becomes easy to control the light source for reducing the light emission delay time and improving the response characteristics of the light source in a short time.

A configuration of an image forming apparatus in this embodiment is similar to the first embodiment shown in FIG. 4.

Figure 23:
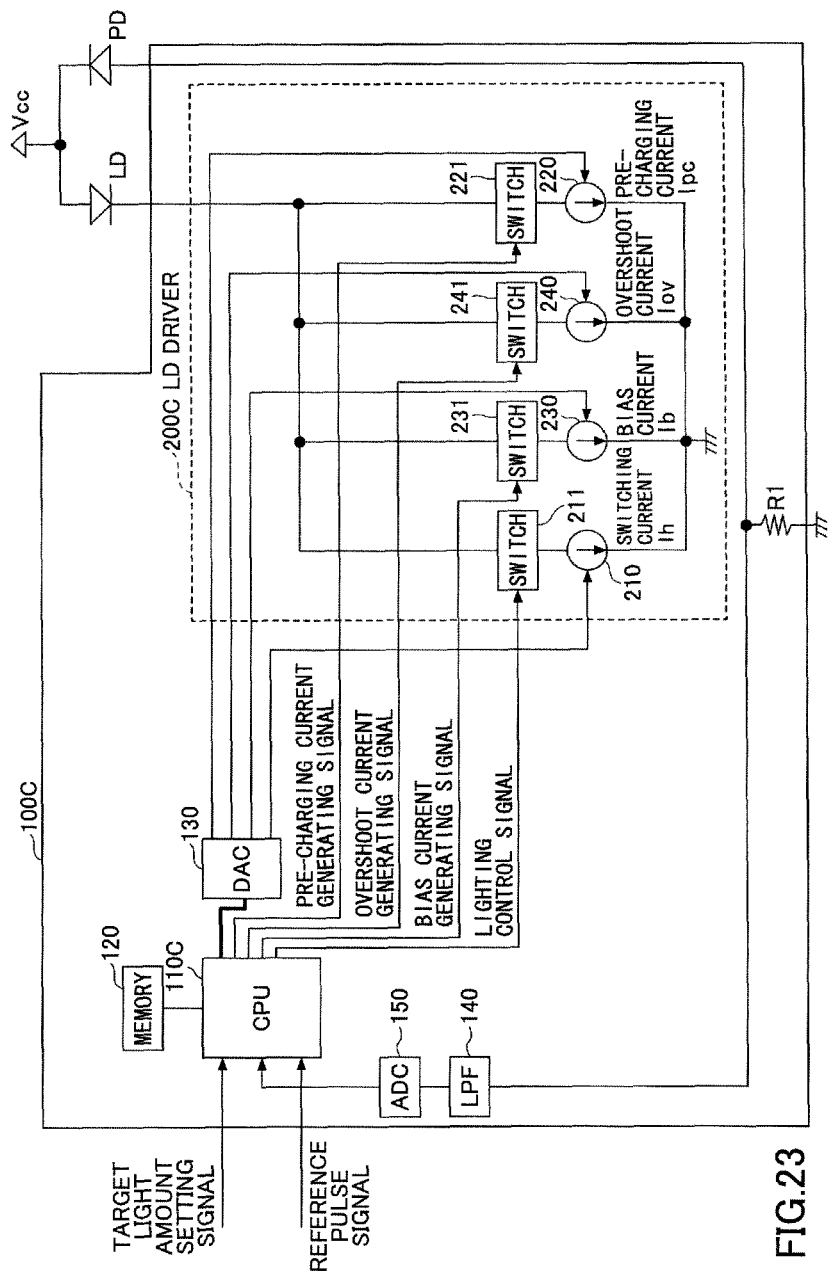
FIG. 23 is a diagram for explaining the light source drive circuit according to the fourth embodiment.

With reference to FIG. 23, a light source drive circuit 100C in this embodiment is explained.

The light source drive circuit 100C according to the present embodiment includes a CPU (central processing unit) 110C; a memory 120; a DAC (digital to analog converter) 130; an LPF (low-pass filter) 140; an ADC (analog to digital converter) 150; an LD driver 200C; and a resistor R1. The resistor R1 does not have to be included in the light source drive circuit 100C. In this case, the resistor R1 is grounded outside the light source drive circuit 100C.

The light source drive circuit 100C according to the present embodiment that is connected between the LD and the PD, controls driving of the LD based on the electrical signal output from the PD in accordance with a received light amount of the PD.

The CPU 110C controls various operations of the light source drive circuit 100C. The memory 120 stores various values, etc., for use in the operations of the light source drive circuit 100C. Details of the values stored in the memory 120 and functions of the CPU 110C are described below.

The DAC 130 converts a signal output from the CPU 110C into analog values. The LPF 140 passes a signal of a predetermined band out of electrical signals output from the PD. The ADC 150 converts the electrical signal output from the LPF 140 into digital values.

The LD driver 200C generates a drive current to be supplied to the LD based on the reference pulse signal and the target light amount setting signal and controls a light emission timing of the LD. The LD driver 200C in the present embodiment generates the drive current Ik which includes the pre-charging current Ipc rising prior to the predetermined current Iop and the overshoot current value Iov rising as synchronized with the predetermined current Iop.

The light source drive circuit 100C in this embodiment may control the drive current Ik by using the CPU 110C and the LD driver 200C. In particular, the light source drive circuit 100C calculates the value of the overshoot current Iov responding to the light output of the LD in advance and generates the drive current Ik including the pre-configured pre-charging current Ipc and the overshoot current value Iov.

The LD driver 200C in this embodiment is described below. The LD Driver 200C has a switching current source 210, a pre-charging current source 220, a bias current source 230, an overshoot current source 240, and switches 211, 221, 231, 241.

The switching current source 210, the pre-charging current source 220, the bias current source 230, and the overshoot current source 240 generate the drive current Ik of the LD. In this embodiment, the drive current Ik is calculated as a sum of current values output from the current sources.

The switching current source 210 generates the predetermined switching current Ih responding to the lighting control signal from the CPU 110C. The switching current source 210 is connected to the LD via the switch 211. The switch 211 may be configured using a transistor, for example. The switch 211 turns on and off in response to a pulse signal S1 shown in FIG. 25. A rise of the pulse signal S1 is delayed from a rise of the reference pulse signal supplied from the CPU 110C by the pre-charging period Tpc. A value of the switching current Ih is set according to an instruction from the CPU 110C.

The bias current source 230 generates the predetermined bias current Ib based on a bias current generating signal from the CPU 110C. The bias current source 230 is connected to the LD via the switch 231. The switch 231 may be configured using a transistor, for example. The switch 231 turns on and off in response to the bias current generating signal supplied from the CPU 110C. A value of the bias current Ib is set according to an instruction from the CPU 110C.

The pre-charging current source 220 generates the pre-charging current Ipc as a first auxiliary drive current which is supplied to the LD prior to the switching current Ih. The pre-charging current source 220 is connected to the LD via the switch 221. The switch 221 may be configured using a transistor, for example. The switch 221 turns on and off in response to the pre-charging current generating signal supplied from the CPU 110C. In the present embodiment, the pre-charging period Tpc indicates a time period for which the pre-charging current generating signal is on. In particular, the switch 221 in this embodiment turns on for the pre-charging period Tpc from a rise of the lighting control signal.

The overshoot current source 240 generates the overshoot current Iov as a second auxiliary drive current which supplements the switching current Ih on a rise of the pulse signal S1. The overshoot current source 240 is connected to the LD via the switch 241. The switch 241 may be configured using a transistor, for example. The switch 241 turns on and off in response to the overshoot current generating signal supplied from the CPU 110C. In the present embodiment, the overshoot period Tov indicates a time period for which the overshoot current generating signal is on. In particular, the switch 241 in this embodiment turns on for the pre-charging period Tov from a rise of the switching signal.

Figure 24:
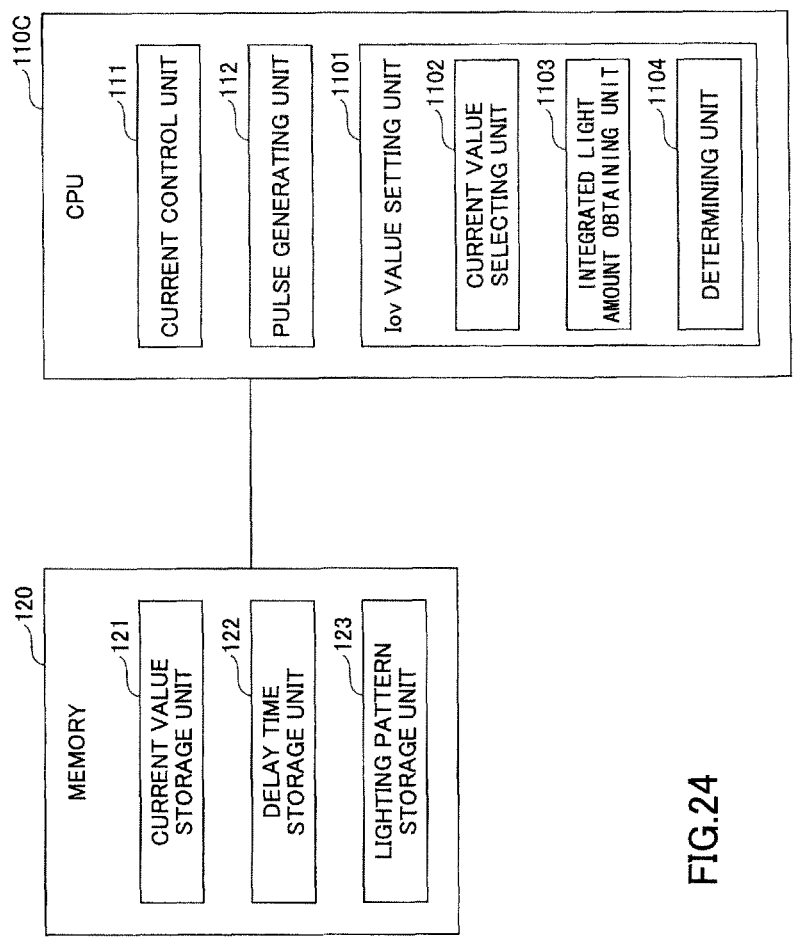
FIG. 24 is a diagram for explaining values stored in a memory and a functional configuration of a CPU.

With reference to FIG. 24, functions of the CPU 110C and values stored in the memory 120 are explained. FIG. 24 shows a configuration of functions of the CPU 110C and the values stored in the memory 120.

The CPU 110C in this embodiment has a current control unit 111, a pulse generating unit 112, and an Iov value setting unit 1101.

The memory 120 has a current value storage unit 121, a delay time storage unit 122, and a lighting pattern storage unit 123. The current value storage unit 121 stores setting values for current sources of the light source drive circuit 100C. In particular, the current value storage unit 121 has values for a switching current Ih, a bias current Ib, and a pre-charging current Ipc.

The delay time storage unit 122 stores a delay time to determine the pre-charging period Tpc and the overshoot period Tov. The lighting pattern storage unit 123 stores a lighting pattern signal for the LD which is used when the Iov value setting unit 1101 (details are discussed later) calculates the overshoot current value Iov.

The current control unit 111 in the CPU 110C obtains the setting values for the current sources which are stored in the current value storage unit 121 and causes the current sources to output currents in response to the setting values via the DAC 130.

The pulse generating unit 112 generates the pre-charging current generating signal and the overshoot current generating signal based on the delay time stored in the delay time storage unit 122 and the reference pulse signal. Also, the pulse generating unit 112 may generate the bias current generating signal and the lighting pattern signal. The lighting pattern signal in this embodiment is provided for the switch 211 only when the Iov value setting unit 1101 calculates the overshoot current value Iov. When the image forming apparatus 10 is forming images, the switch 211 is turned on and off in response to the lighting control signal based on data of the images supplied from the write control unit 10.

The Iov value setting unit 1101 calculates and sets the overshoot current value Iov according to the output of the PD. The Iov value setting unit 1101 has a current value selecting unit 1102, an integrated light amount obtaining unit 1103, and a determining unit 1104. Details of the Iov value setting unit 1101 are discussed later.

Figure 25:
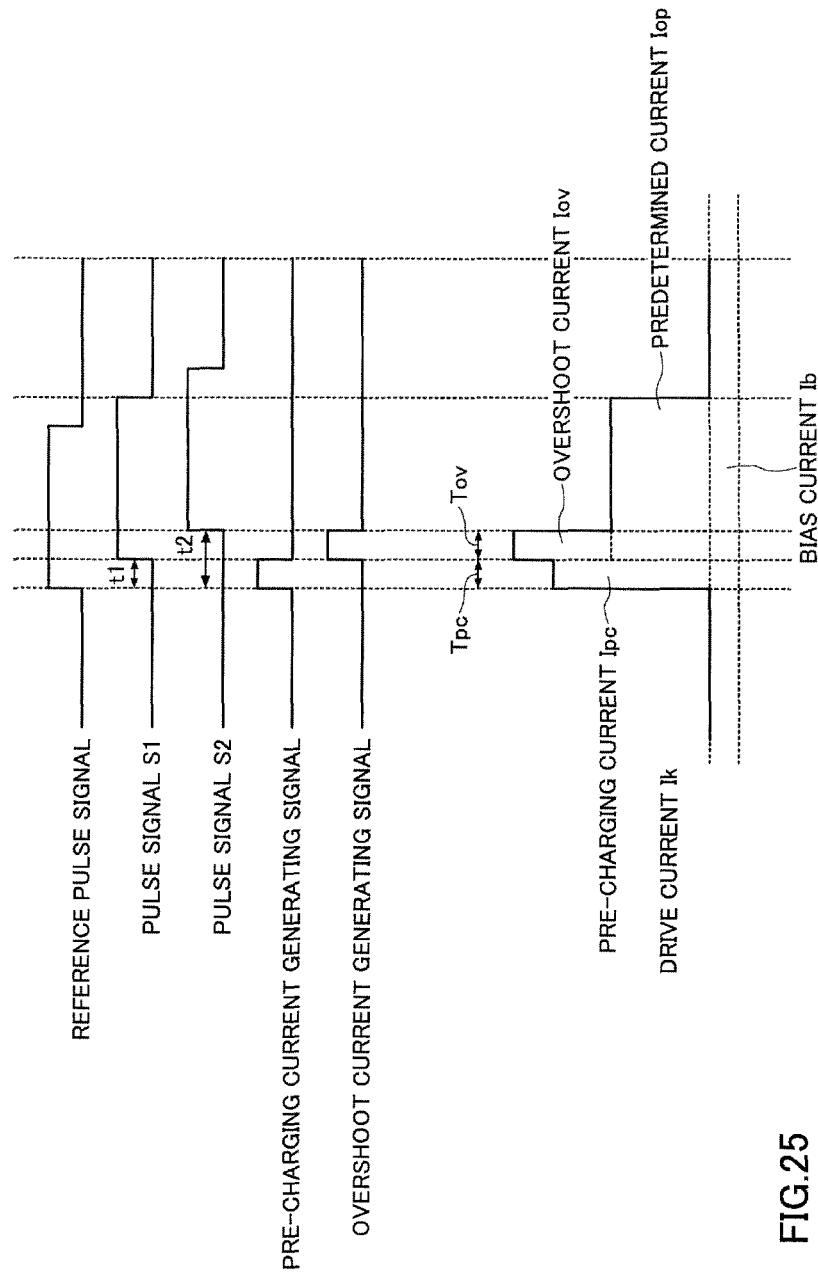
FIG. 25 is a diagram for explaining generation of a pre-charging current generating signal and an overshoot current generating signal.

With reference to FIG. 25, it is explained how the pulse generating unit 112 generates the pre-charging current generating signal and the overshoot current generating signal. FIG. 25 shows the generating scheme for the pre-charging current generating signal and the overshoot current generating signal.

The pulse generating unit 112 in this embodiment obtains from the delay time storage unit 122 a delay time t1 and a delay time t2. The delay time t1 corresponds to the pre-charging period Tpc. The delay time t2 corresponds to a sum of the pre-charging period Tpc and the overshoot period Tov. The pulse generating unit 112 generates a pulse signal S1 by delaying the reference pulse signal by t1 and a pulse signal S2 by delaying the reference pulse signal by t2. Here, the pulse generating unit 112 generates the pre-charging current generating signal in order that the pre-charging current generating signal is high when the reference pulse signal is high and the pulse signal S1 is low (i.e. for pre-charging period Tpc). In addition, the pulse generating unit 112 generates the overshoot current generating signal in order that the overshoot current generating signal is high when the reference pulse signal is high and the pulse signal S2 is low (i.e. for overshoot period Tov).

The pulse generating unit 112 in this embodiment stores the delay times t1, t2 in the memory 120; however, it is not limited to the embodiment. The delay times t1, t2 in this embodiment may be obtained by means other than the above stated example. For example, the pulse generating unit 112 in this embodiment may generate the pulse signals S1, S2 by using an inverter or buffer column. Alternatively, the pulse generating unit 112 may generate the pulse signals S1, S2 by delaying the reference pulse signal using a low pass filter including a resistance unit and a condenser and then forming the waveform. It is easy to change the amount of delay by modifying the number of columns or the constant number of the filter.

Figure 26:
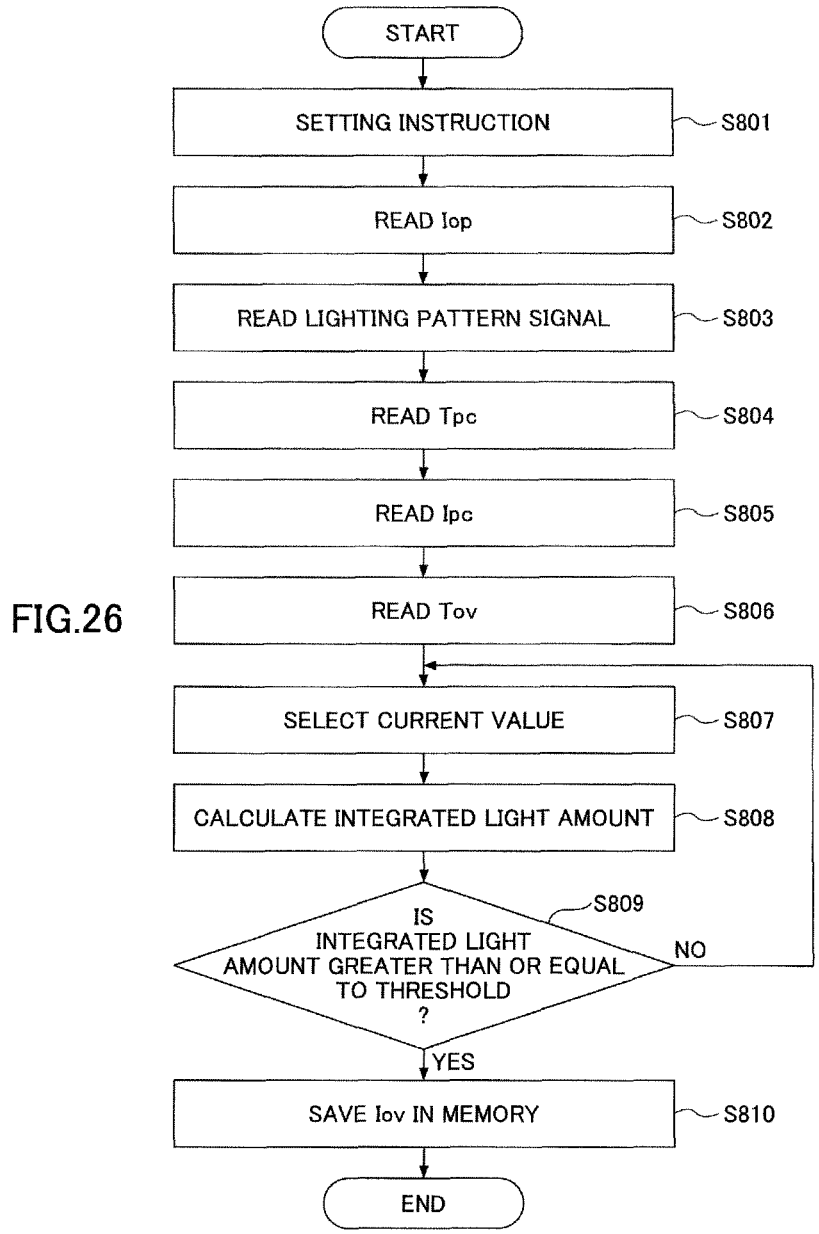
FIG. 26 is a flowchart for explaining a process of an by value setting unit according to the fourth embodiment.

Next, setting of the pre-charging current Iov by the Iov value setting unit 1101 of the evaluation apparatus 300 if the present embodiment is explained with reference to FIG. 26. FIG. 26 is a flowchart for explaining a process of the Iov value setting unit 1101 in the evaluation apparatus 300.

When an integrated light amount ratio of an output waveform of the PD when a light is caused to be emitted from the LD based on a lighting pattern signal falls within a predetermined range, the Iov value setting unit 1101 according to the present embodiment sets a current value as a value of the overshoot current Iov. The integrated light amount ratio is a value indicating a proportion of an integrated light amount of an output waveform of the PD relative to an integrated light amount corresponding to one period of the lighting pattern signal.

First, the CPU 110C initially accepts an instruction for setting the overshoot current Iov (step S801). According to the present embodiment, the setting instruction is accepted when starting supplying of a drive current Ik to the LD again after the supplying of the drive current Ik from the light source drive circuit 100C to the LD is stopped. This setting instruction may be provided from a main CPU (not shown) which controls the whole operation of the image forming apparatus 10 to the CPU 110C, for example. More specifically, according to the present embodiment, the setting instruction is accepted, for example, when the image forming apparatus 10 is activated from a sleep mode, or when a door provided in a housing of the image forming apparatus 10 is opened and then closed, etc.

Next, the Iov value setting unit 1101 reads a value of a predetermined current Iop from the current value storage unit 121 (step S802). Next, the Iov value setting unit 1101 reads a lighting pattern signal from the lighting pattern signal storage unit 123 (step S803). The lighting pattern signal according to the present embodiment is a signal which is generated in advance such as to turn on the LD corresponding to one pixel and turn off the LD corresponding to one pixel.

Next, the by value setting unit 1101 reads the delay time t1, or, in other words, the pre-charging period Tpc from the delay time storage unit 122 (step S804). Next, the Iov value setting unit 1101 reads a value of the pre-charging current Ipc from the current value storage unit 121 (step S805). Next, the Iov value setting unit 1101 reads the delay time t2 from the delay time storage unit 122 and reads, as an overshoot period Tov, the difference between the delay times t2 and t1 (step S806).

Next, the Iov value setting unit 1101 outputs, to the DAC 130, a current value selecting signal for selecting a current value by the current value selecting unit 1102 (step S807). The current value selecting unit 1102 selects, in an ascending order, a current value of the current values which can be output in the DAC 130.

When the current value selecting signal is received from the CPU 110C, the DAC 130 converts the selected current value to an analog value to output the converted analog value to the overshoot current source 240. The overshoot current source 240 supplies a selected current value to the LD. Then, the pulse generating unit 112 supplies an overshoot current generating signal which is synchronized with a rise of the lighting pattern signal. The overshoot current generating signal turns on the switch 241 only for the second overshoot period Tov read in step S806.

Next, the Iov value setting value 1101 calculates an integrated light amount ratio of an output waveform of the PD by the integrated light amount obtaining unit 1103 (step S808). Next, the Iov value setting unit 1101 determines whether the calculated integrated light amount ratio is within a predetermined range by the determining unit 1104 (step S809).

When the integrated light amount ratio is within a predetermined range in step S809, the Iov value setting unit 1101 sets the then selected current value as a value of the overshoot current Iov. In step S809, when the integrated light amount ratio is not within the predetermined range, the Iov value setting unit 1101 returns to step S807, and selects the second largest current value.

Figure 27:
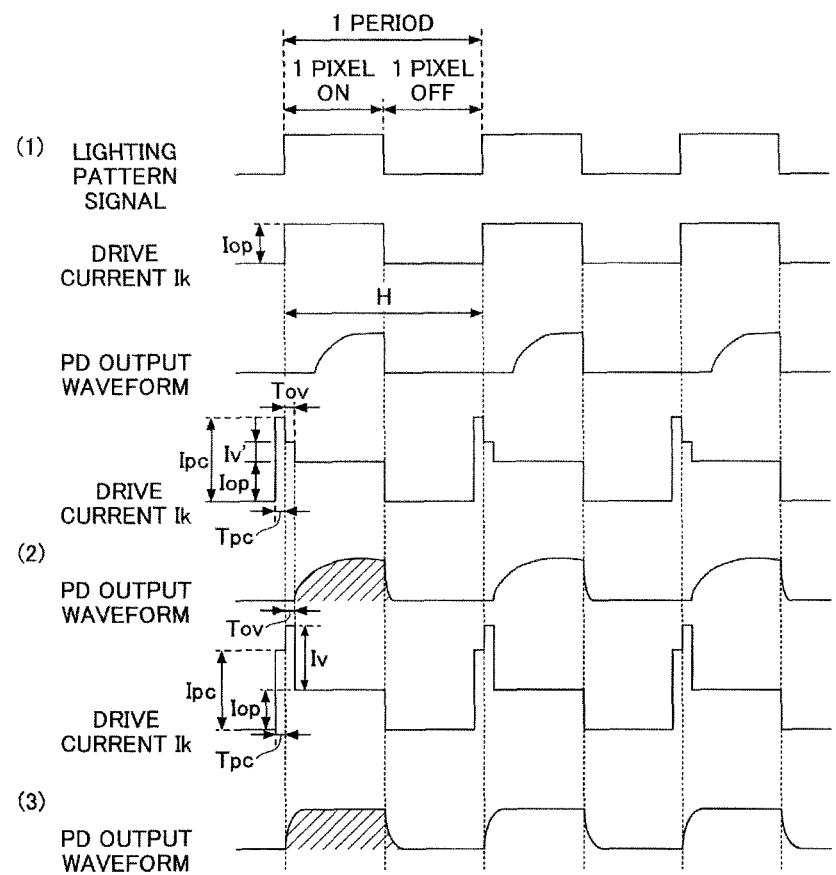
FIG. 27 is a diagram for explaining an overshoot current Iov.

Below, with reference to FIG. 27, the overshoot current Iov is further explained. FIG. 27 is a diagram for explaining the overshoot current Iov.

FIG. 27 shows a case in which a predetermined range is set to ±5% with 50% as a center value, for example, in order to make the output waveform of the PD close to an ideal waveform without a light emission delay. The predetermined range, which is a preset value, may be arbitrarily set.

FIG. 27, in (1), shows an output waveform of the PD in case a current value has not been selected by the current value selecting unit 1102 and the drive current Ik becomes the predetermined current Iop which is synchronized with a lighting pattern signal. In this case, an integrated light amount ratio of the output waveform of the PD in a time period H corresponding to one period of the lighting pattern signal becomes less than 45%.

FIG. 27, in (2), shows an output waveform of the PD when a smallest current value Iv' is selected by the current value selecting unit 1102. Then, the drive current Ik is overshot by an amount corresponding to a current value Iv' from a rise to the end of the overshoot period Tov. In this case as well, the integrated light amount ratio of the output waveform of the PD in the time period H corresponding to one period of the lighting pattern signal becomes less than 45%.

Next, FIG. 27 in (3) shows an output waveform of a PD when a current value Iv larger than the current value Iv' is selected by the current value selecting unit 1102. Then, the drive current Ik is overshot by an amount corresponding to a current value Iv' from a rise to the overshoot period Tov. In this case, an integrated light amount ratio of the output waveform of the PD in a time period H corresponding to one period of the lighting pattern signal becomes between 50% to 55%.

Therefore, the by value setting unit 1101 sets the current value Iv as a value of the overshoot current Iov.

As described above, according to the present embodiment, the value of the pre-charging overshoot current Ipc and the pre-charging period Tpc, which are stored in advance in the memory 120, are used without changing them even when a predetermined light amount Po to be targeted and a predetermined current Iop change. As for the value of the overshoot current Iov, it is adjusted and used every time an amount of light emitted from the light source changes in the present embodiment. Thus, according to the present embodiment, the pre-charging current Ipc may be set only once, so that a value may be adjusted only for the value of the overshoot current Iov. Therefore, the present embodiment makes it possible to reduce an adjustment time and to reduce the circuit scale.

Figure 28:
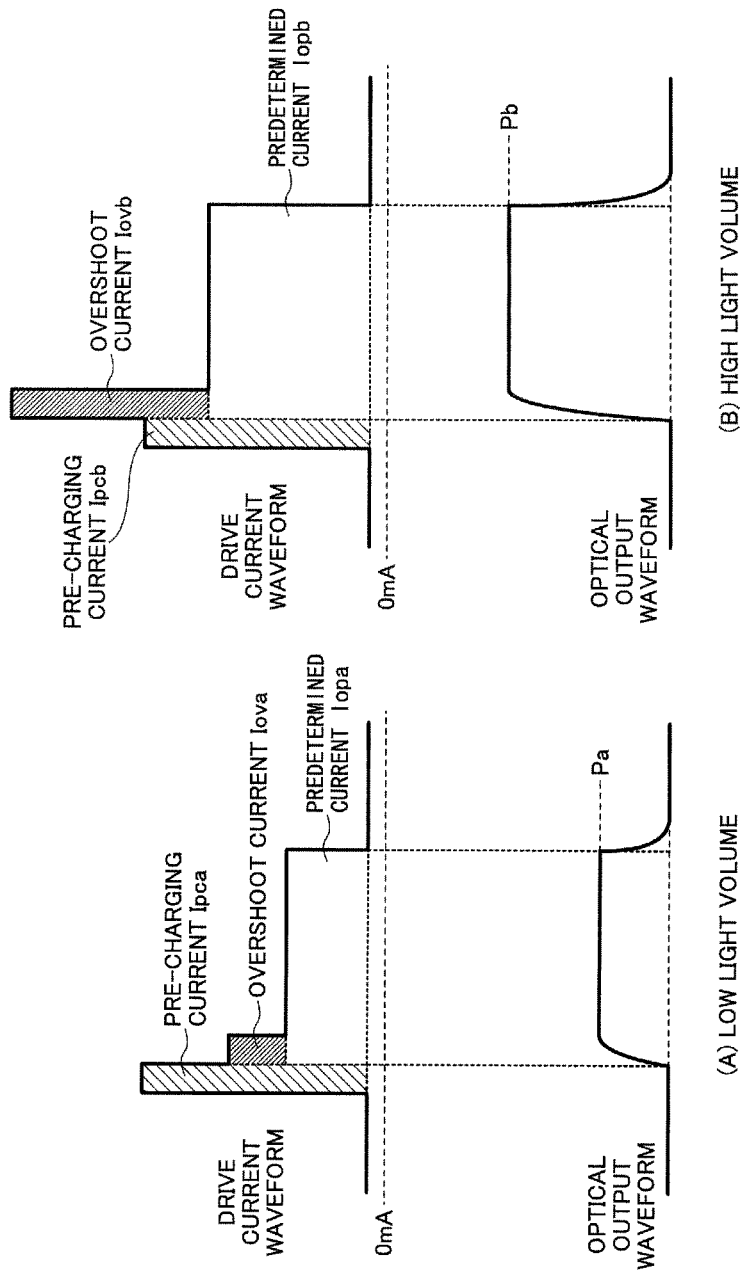
FIG. 28 is a diagram illustrating an example of the drive current waveform and the optical output waveform when the overshoot current by is changed.

FIG. 28 is a diagram illustrating an example of a drive current waveform and an optical output waveform when a light amount of the light source changes. FIG. 28 (A) shows the drive current waveform and the optical output waveform at a time of a low light amount (Pa), while FIG. 28 (B) shows a drive current waveform and an optical output waveform at a time of a high light amount (Pb). Moreover, the relative magnitude of a value of a predetermined current Iopa in FIG. 28 (A) and a value of a predetermined current Iopb in FIG. 28 (B) becomes such that Iopa<Iopb. This is because a light amount changes in accordance with a magnitude of the value of the predetermined current Iop.

Focusing on the overshoot current Iov in FIG. 28, it is seen that the current amount changes with a change in the light amount. The current amount is determined by multiplying a value of the overshoot current Iov with the overshoot period Tov.

In the examples in FIG. 28, a value of the overshoot current Iov increases with an increase in the light amount. Thus, the relative magnitude of the value of the overshoot current Iova in FIG. 28 (A) and the value of the overshoot current Iovb in FIG. 28 (B) becomes such that Iova<Iovb. On the other hand, the value of the pre-charging current Ipc is primarily determined based on the whole system such as wiring of a board, packaging of a light source, etc., so that the current value does not change even when the magnitude of the predetermined light amount Po and the magnitude of the predetermined current Iop are changed, yielding a relationship of Ipca=Ipcb. In this way, the present embodiment makes it possible to obtain a stable optical output waveform with a simple setting of adjusting only a value of the overshoot current Iov when the light amount is changed.

While the overshoot period Tov is set to be a fixed value which corresponds to the difference between the delay times t1 and t2 stored in the memory in the present embodiment, the value of the delay time t2 may be changed to change the overshoot period Tov.

In the present embodiment, the values of the pre-charging period Tpc and the pre-charging current Ipc are preset using the above-mentioned evaluation apparatus 300 as discussed with reference to FIGS. 9-14.

Figure 29:
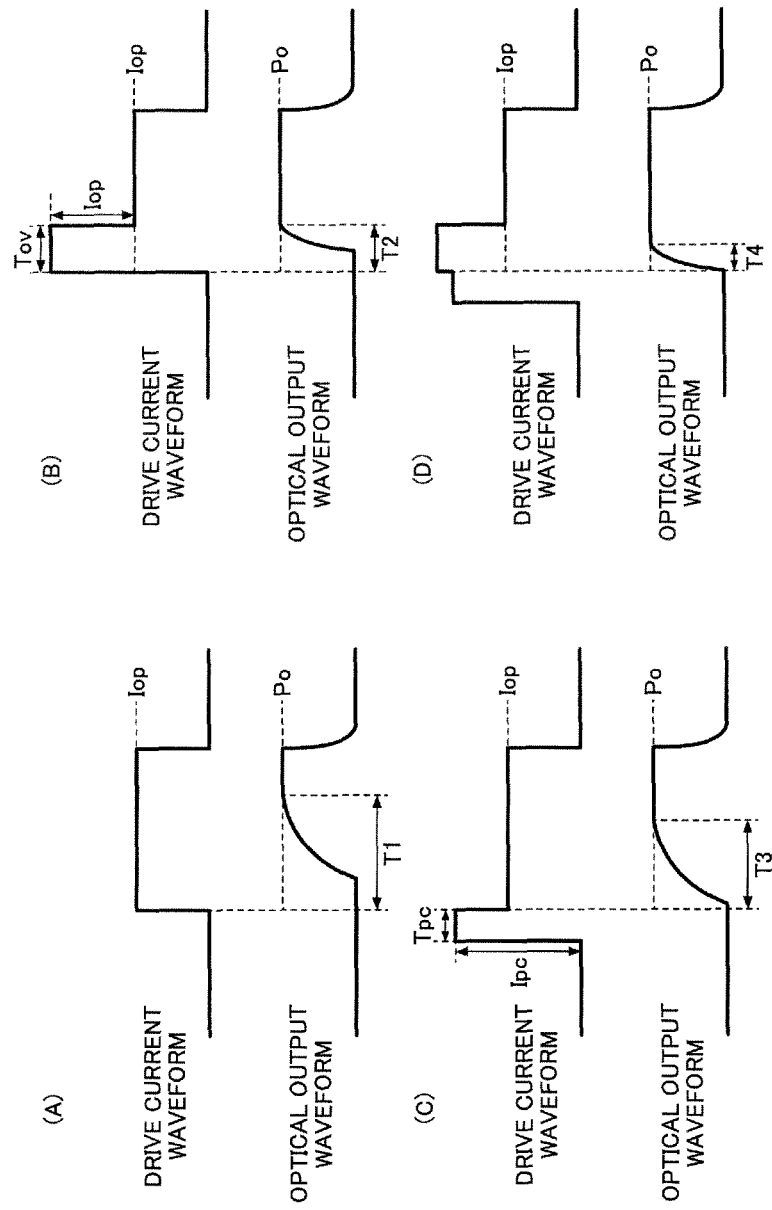
FIG. 29 is diagram for explaining an advantageous effect of the fourth embodiment.

FIG. 29 explains effects of the present embodiment. FIG. 29 (A) shows a drive current waveform and an optical output waveform when only a predetermined current Iop is applied to the LD. FIG. 29 (B) shows a drive current waveform and an optical output waveform when the predetermined current Iop and the overshoot current by are applied to the LD. Furthermore, FIG. 29 (C) shows a drive current waveform and an optical output waveform when the predetermined current Iop and the pre-charging current Ipc are applied to the LD. FIG. 29 (D) shows a drive current waveform and an optical output waveform when the predetermined current Iop, the overshoot current Iov, and the pre-charging current Ipc are applied to the LD.

In FIG. 29 (A), the drive current waveform is a rectangular wave, while there is dullness in a rise of the optical output waveform. In FIG. 29 (A), a light emission delay time T1 is from when supplying the drive current to the light source is started to when the light source outputting a predetermined light amount Po occurs. Thus, the light amount ensured is not enough for the ideal output. In FIG. 29 (B), the drive current Ik further includes the overshoot current value Iov in addition to the predetermined current Iop. Compared to the optical output waveform shown in FIG. 29 (A), in the optical output waveform shown in FIG. 29 (B), the dullness in the rise is improved and the waveform starts faster. In addition, the light emission delay time T2 is shorter than the light emission delay time T1. However, the light amount is not enough yet for the ideal output.

When the larger overshoot current by value is chosen in FIG. 29 (B), the light emission delay time T2 may be reduced further. However, the LD may be degraded faster because the LD emits light over the predetermined light amount Po.

In FIG. 29 (C), the light emission delay time T3 is shorter than the light emission delay time T1 because the pre-charging current Ipc charges the circuit to overcome the parasitic capacitance of the circuit in advance. However, dullness in a rise of the optical output waveform still occurs in common with the optical output waveform in FIG. 29 (C).

In FIG. 29 (D) shows a drive current Ik output by the light source drive circuit 100C in the present embodiment. The drive current Ik may result in an optical output waveform improving the dullness which is similar to a square pulse. In addition, a light emission delay time T4 is shorter than the light emission delay times T1, T2, and T3.

As stated above, in the present embodiment, the fixed values of the pre-charging current Ipc and the pre-charging period Tpc are calculated by the evaluation apparatus 300 connected to the light source drive circuit 100C and set to the light source drive circuit 100C. In this embodiment, the pre-charging period Tpc and the pre-charging current Ipc which are properly set to charge the circuit to overcome the parasitic capacitance C in a short time.

Figure 30:
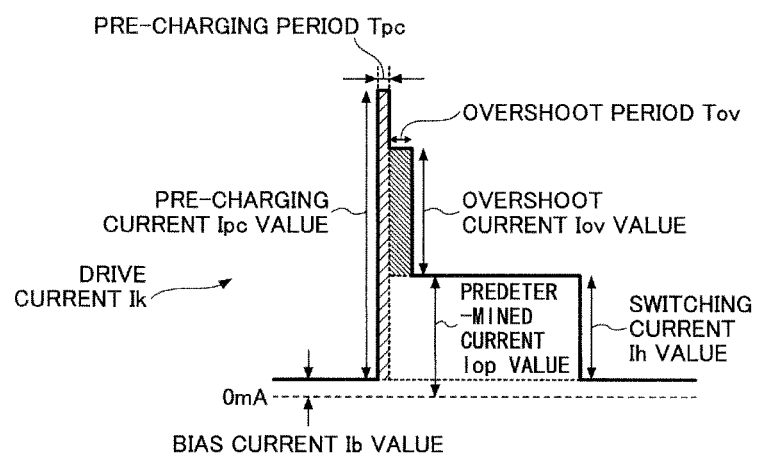
FIG. 30 is a diagram for explaining a drive current waveform when a Tpc setting current Is is input for the pre-charging period.

FIG. 30 show a drive current waveform when the pre-charging period is set using the Tpc setting current Is.

The pre-charging period Tpc is short for the drive current Ik shown in FIG. 30. The pre-charging period Tpc is shorter than a response time of the LD's emission. The emission response time of the LD in the present embodiment indicates the time period from the time when the drive current Ik is generated in the light source drive circuit 100C to the time when the LD starts to emit the light.

For example, the Tpc setting current Is may be a current Imax for obtaining the maximum light amount Pmax of the LD during the pre-charging period Tpc in such a manner that causes the light source which has a large parasitic capacitance or a differential resistance to charge the circuit to overcome the parasitic capacitance quickly. In addition, when the LD has to be driven fast, the drive current Ik may be supplied with enough time when the LD is turned off so that interference from the previous drive current Ik may be avoided.

While the evaluation apparatus 300 is arranged to be connected to the outside of the light source drive circuit 100C, it is not limited thereto. For example, in the light source drive circuit 100C according to the present embodiment, the CPU 110C may include functions included in the evaluation apparatus 300, for example. In this case, the light source drive circuit 100C may save the pre-charging period Tpc and the value of the pre-charging current Ipc in the memory 120 without using the evaluation apparatus 300.

According to the present embodiment, the parasitic capacitance C may be overcome by charging the circuit at high speed by the pre-charging current Ipc to shorten the parasitic delay time ta. Moreover, according to the present embodiment, the response delay time tb may also be reduced due to an effect of the overshoot current Iov value. Thus, the present embodiment makes it possible to reduce the final light emission delay time t and compensate for the required light amount.

Now, in the related art, an LD with a large package, in particular, has various varying factors for the response characteristics such as a resistance component increasing depending on a wavelength band or an increase in the parasitic capacitance. For example, compared to a 780 nm band infrared semiconductor laser, a 650 nm band red light semiconductor laser generally has a large differential resistance; thus, it is not always the case that an optical output response is obtained at high speed, so that dullness of the waveform may occur. Moreover, even with the infrared semiconductor laser, a VCSEL (vertical cavity surface emitting laser), etc., has a differential resistance of around a few hundred Ωs due to a structural difference, which differential resistance is very large compared to that of an edge type laser. Thus, a CR time constant results from a terminal capacitance of a VCSEL itself; a parasitic capacitance of a substrate having mounted thereon the VCSEL; a terminal capacitance of a driver, etc., and a differential resistance of the VCSEL. Therefore, there is a problem that, even when the VCSEL itself has a cutoff frequency Ft or a device property of being able to modulate at high speed, when it is mounted on the substrate, the desired high-speed optical output response is not obtained, causing an increased light emission delay time.

The present embodiment corrects for an optical output waveform in accordance with a parasitic waveform, differential resistance, etc., regardless of a type of light source, making it possible to reduce the light emission delay time and obtain the light output waveform close to a current waveform of the predetermined current Iop. In other words, according to the present embodiment, even when there are multiple light sources such as the VCSEL and the light sources have a large differential resistance, the pre-charging current Ipc and the overshoot current by that are optimum for each light source may be set. Thus, the present embodiment makes it possible to reduce light emission variations among the light sources and to reduce color drift and density variations of images in the image forming apparatus 10, for example. Moreover, according to the present embodiment, the overshoot current by is adjusted in accordance with a light amount and a magnitude of the predetermined current Iop, making it possible to obtain a desired optical output waveform even when the light amount of the light source is changed.

In this way, the present embodiment makes it possible to reduce a light emission delay time of an optical output and to improve a response characteristic.

Fifth Embodiment

Below, a fifth embodiment of the present invention is explained with reference to the drawings. The fifth embodiment of the present invention is different from the fourth embodiment in that a bias current Ib is not included in the drive current Ik. Thus, in the explanation of the fifth embodiment below, only differences from the fourth embodiment are explained and the same letters/numerals used in the explanations of the fourth embodiment are given to those having the same functional configuration as the fourth embodiment, so that the explanations thereof are omitted.

Figure 31:
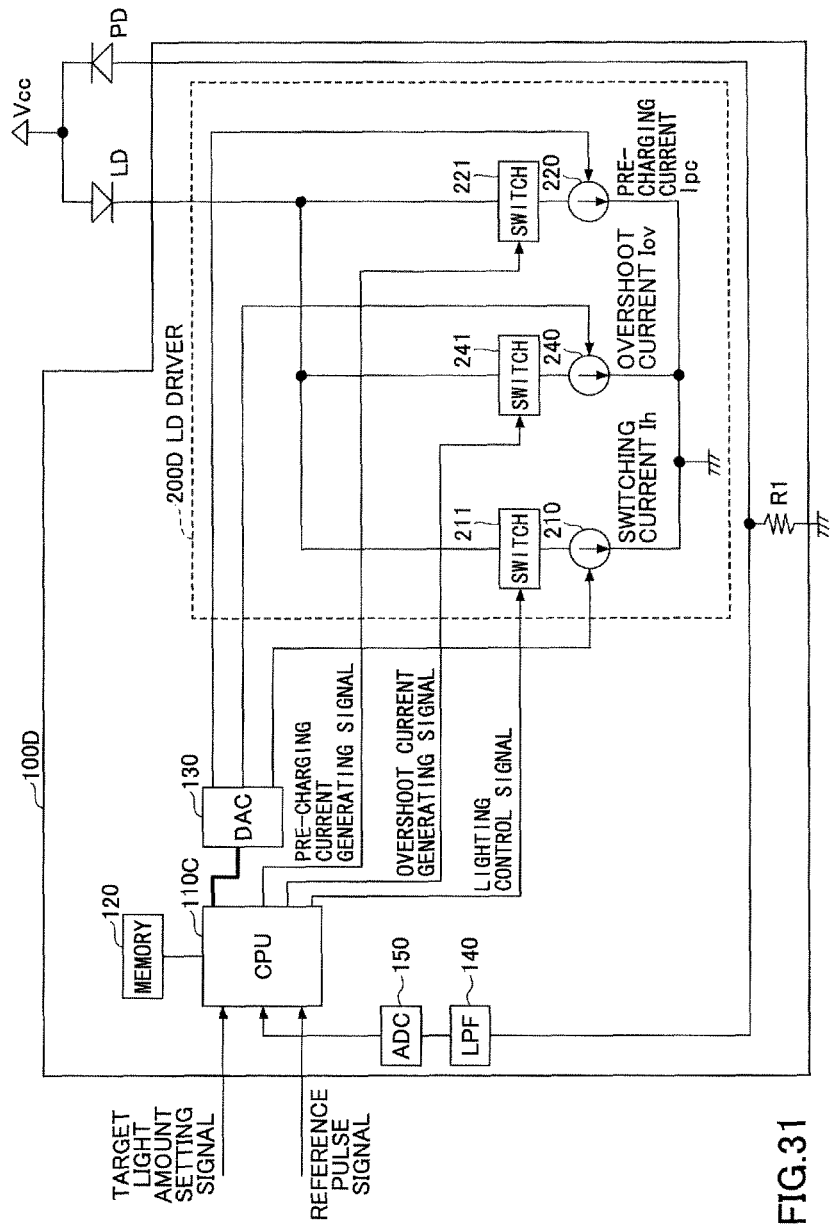
FIG. 31 is a diagram for explaining the light source drive circuit according to a fifth embodiment.

FIG. 31 is a diagram for explaining a light source drive circuit according to the fifth embodiment. A light source drive circuit 100D according to the present embodiment has an LD driver 200D. The LD driver 200D includes a switching current source 210; a pre-charging current source 220; a overshoot current source 240; and switches 211, 221, and 241. The LD driver 200D according to the present embodiment includes output currents from three current sources based on an analog value supplied from the DAC 130 and generates a drive current Ik. More specifically, the LD driver 200D according to the present embodiment generates the drive current Ik including the pre-charging current Ipc supplied prior to a rise of the switching current Ih and the overshoot current Iov supplied in synchronization with a rise of a switching current Ih and supplies the generated drive current Ik to the LD.

Figure 32:
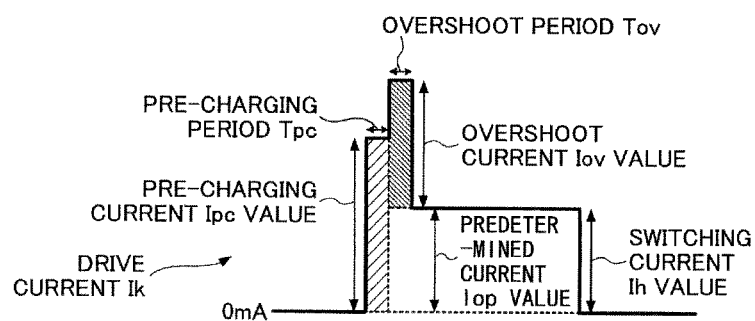
FIG. 32 is a diagram illustrating an example of a drive current waveform according to the fifth embodiment.

FIG. 32 is a diagram illustrating a drive current waveform according to the fifth embodiment.

In the drive current Ik according to the present embodiment, the bias current Ib is not used, so that a value of the switching current Ih and a value of the predetermined current Iop become equal.

Sixth Embodiment

With reference to the drawings, a sixth embodiment of the present invention is explained with reference to the drawings. The sixth embodiment of the present invention is different from the fourth embodiment in that the drive current Ik includes an undershoot current. Thus, for the sixth embodiment of the present invention, only differences from the fourth embodiment are explained and the same letters/numerals used in the explanations of the sixth embodiment are given to those having the same functional configurations as the fourth embodiment, so that the explanations thereof are omitted.

A light source drive circuit in the sixth embodiment is in common with the light source drive circuit 100B shown in FIG. 18. Thus, the following discussion is based on the light source drive circuit 100B with reference to FIG. 18.

A light source drive circuit 100B according to the present embodiment includes a LD driver 200B. The light source drive circuit 100B includes a CPU 110B and the LD driver 200B. The LD driver 200B includes a switching current source 210; a pre-charging current source 220, a bias current source 230; an overshoot current source 240; an undershoot current source 250; and switches 211, 221, 231, 241, 251. A connection of the undershoot current source 250 with the LD is controlled by on/off of the switch 251. When the switch 251 is turned on, the undershoot current source 250 supplies an undershoot current Iud to the LD in synchronization with a fall of a switching current Ih.

On/off of the switch 251 is controlled by an undershoot generating signal supplied from the CPU 110B. More specifically, the switch 251 is turned on during a period (below called an "undershoot period" Tud) in which the undershoot generating signal is at a high level.

Figure 33:
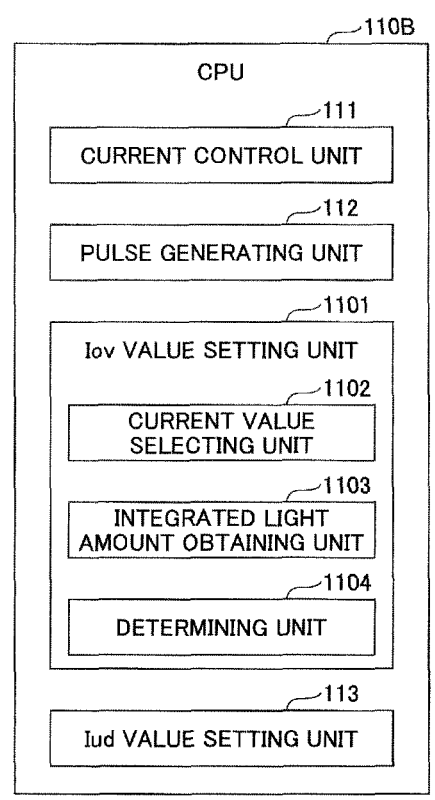
FIG. 33 is a diagram for explaining a functional configuration of the CPU of a sixth embodiment.

FIG. 33 is a diagram for explaining a functional configuration of the CPU 110B according to the sixth embodiment. The CPU 110B according to the present embodiment includes an Iud value setting unit 113 in addition to the respective units included in the CPU 110C according to the fourth embodiment.

The Iud value setting unit 113 according to the present embodiment refers to the memory 120 and calculates a sum of a current amount of a pre-charging current Ipc and an overshoot current Iov. The current amount is defined by a current value x on time. More specifically, for example, the current amount of the pre-charging current Ipc is a product of the value of the pre-charging current Ipc and the pre-charging period Tpc. The current amount of the overshoot current by is a product of the value of the overshoot current by and the value of the overshoot period Tov.

Then, the Iud value setting unit 113 sets the value of the undershoot current Iud and the undershoot period Tud such that a sum of the two current amounts Ipc and Iov, and the current amount of the undershoot current Iud become equal.

For the undershoot current Iud, roles are played of correcting for dullness in a fall of the optical output waveform and discharging a previous charge by the overshoot current Ipc, etc. that overcame a parasitic capacitance of the circuit. Therefore, the current amount of the undershoot current needed for improving the optical output waveform becomes almost equal to the current amount of the overshoot current Iov and the current amount of the undershoot current Iud, needed for discharging previous charge that overcame the parasitic capacitance, becomes almost equal to the current amount of the pre-charging current Ipc.

Thus, according to the present embodiment, the current amount of the undershoot current Iud may be set such that it becomes equal to the sum of the two current amounts to further improve a response characteristic of the optical output waveform.

Moreover, according to the present embodiment, the undershoot current Iud is set using the pre-charging current Ipc and the overshoot current Iov values, so that complex operations, etc., are not needed, making it possible to speedily set the undershoot current Iud. Moreover, according to the present embodiment, the undershoot period Tud may be set equal to the overshoot period Tov. In this case, a response at the time of a rise of the optical output waveform and a response at the time of a fall may be set to be almost equal.

Figure 34:
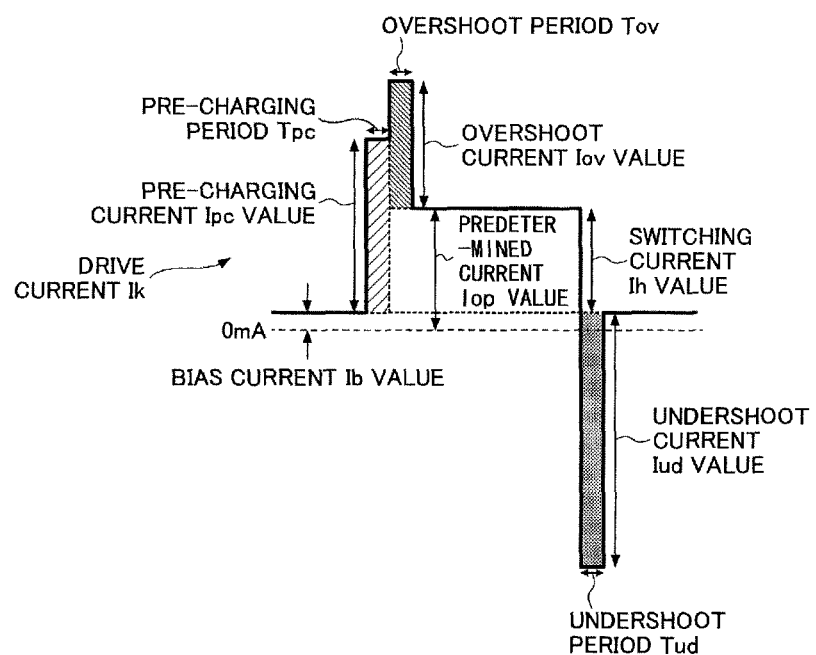
FIG. 34 is a diagram illustrating an example of a drive current waveform according to the sixth embodiment.

FIG. 34 is a diagram illustrating a drive current waveform according to the sixth embodiment.

In the drive current Ik according to the present embodiment, the undershoot current Iud is applied in synchronization with a fall of the predetermined current Iop according to the fourth embodiment. The undershoot current Iud may reduce dullness in the fall of the optical output waveform and further speedily discharge the previous charge that overcame the parasitic capacitance.

While the present invention has been described in the above based on the respective embodiments, the present invention is not to be limited to requirements shown in the above-described embodiments. These points may be changed within a range which does not impair the gist of the invention and may be appropriately determined in accordance with applications thereof.

The present application is based upon and claims the benefit of priority of Japanese Patent Application No. 2012-255469 filed on Nov. 21, 2012, and Japanese Patent Application No. 2012-255471 filed on Nov. 21, 2012, the entire contents of which are incorporated herein by reference.

Patent Document

[Patent Document 1] Japanese Patent No. 4349470
[Patent Document 2] Japanese Patent No. 3466599
[Patent Document 3] Japanese Patent No. 3578596

What is claimed is:

1. A light source drive circuit for driving a light source, comprising:
   a drive current generating unit configured to generate a drive current, the drive current including a predetermined current for obtaining a predetermined light amount from the light source, a first auxiliary drive current input to the light source prior to input of the predetermined current, and a second auxiliary drive current added to the predetermined current in synchronization thereto; and
   a signal generating unit configured to generate a first signal and a second signal, the first signal causing the first auxiliary drive current to be input for a first period and the second signal causing the second auxiliary drive current to be applied to the predetermined current for a second period,
   wherein the first period is configured to be shorter than a period from a rise of the predetermined current to when a light amount from the light source reaches the predetermined light amount with the predetermined current;
   a light receiving element configured to receive light emitted from the light source and output a signal of a magnitude corresponding to an amount of the light received;
   an integrating unit configured to integrate a signal waveform output from the light receiving element;
   a current value setting unit configured to set a value of the second auxiliary drive current; and
   a lighting pattern storage unit configured to store therein a lighting pattern signal for lighting the light source for a predetermined period and turning off the light source for a predetermined period,
   wherein the current value setting unit includes
      a current value selecting unit configured to select one of current values to be added to the predetermined current in an ascending order thereof; and
      a determining unit configured to determine whether an integrated value of the signal waveform of the light receiving element, when a current in which the current value is added to the predetermined current is supplied to the light source based on the lighting pattern signal, is within a predetermined range which is set in advance,
   wherein the current value is set to the second auxiliary drive current when the integrated value falls within the predetermined range.

2. The light source drive circuit as claimed in claim 1, wherein the drive current includes an undershoot current which is subtracted from the predetermined current in synchronization with a fall of the predetermined current, and wherein a current amount of the undershoot current is equal to a sum of a current amount of the first auxiliary drive current and a current amount of the second auxiliary drive current.

3. The light source drive circuit as claimed in claim 2, wherein an undershoot period in which the undershoot current is subtracted from the predetermined current is equal to the second period.

4. An optical scanning apparatus, comprising:
   a light source;
   a reflecting mirror configured to cause a light irradiated from the light source to be reflected; and
   the light source drive circuit as claimed in claim 1.

5. An image forming apparatus, comprising:
   a light source;
   a reflecting mirror configured to cause a light irradiated from the light source to be reflected;
   a photosensitive body configured to be scanned by a reflected light which is reflected by the reflecting mirror; and
   the light source drive circuit as claimed in claim 1.

6. A light source drive circuit for driving a light source, comprising:
   a drive current generating unit configured to generate a drive current, the drive current including a predetermined current for obtaining a predetermined light amount from the light source, a first auxiliary drive current input to the light source prior to input of the predetermined current, and a second auxiliary drive current added to the predetermined current in synchronization thereto; and
   a signal generating unit configured to generate a first signal and a second signal, the first signal causing the first auxiliary drive current to be input for a first period and the second signal causing the second auxiliary drive current to be applied to the predetermined current for a second period,
   wherein the first period is configured to be shorter than a period from a rise of the predetermined current to when a light amount from the light source reaches the predetermined light amount with the predetermined current;
   a light detector which receives emitted light from the light source and outputs a signal corresponding to an amount of the emitted light;
   an integrator which integrates the signal output from the light detector, wherein the light source drive circuit detects light emission when an integrated value obtained by the integrator becomes equal to or larger than a Tpc threshold;
   a current value setting unit configured to set a value of the second auxiliary drive current; and
   a lighting pattern storage unit configured to store therein a lighting pattern signal for lighting the light source for a predetermined period and turning off the light source for a predetermined period,
   wherein the current value setting unit includes
      a current value selecting unit configured to select one of current values to be added to the predetermined current in an ascending order thereof; and
      a determining unit configured to determine whether the integrated value of the signal waveform of the light receiving element, when a current in which the current value is added to the predetermined current is supplied to the light source based on the lighting pattern signal, is within a predetermined range which is set in advance,
   wherein the current value is set to the second auxiliary drive current when the integrated value falls within the predetermined range.

* * * * *